(12) United States Patent
Lu

(10) Patent No.: US 7,611,580 B2
(45) Date of Patent: Nov. 3, 2009

(54) CONTROLLING MELT-SOLID INTERFACE SHAPE OF A GROWING SILICON CRYSTAL USING A VARIABLE MAGNETIC FIELD

(75) Inventor: Zheng Lu, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 11/753,722

(22) Filed: May 25, 2007

(65) Prior Publication Data

US 2007/0227442 A1 Oct. 4, 2007

Related U.S. Application Data

(62) Division of application No. 11/026,780, filed on Dec. 30, 2004, now Pat. No. 7,223,304.

(51) Int. Cl.
*C30B 35/00* (2006.01)

(52) U.S. Cl. .................. 117/200; 117/30; 117/32; 117/208; 117/917

(58) Field of Classification Search ............ 117/30, 117/32, 201, 202, 208, 213, 917
See application file for complete search history.

(56) References Cited

U.S. PATENT DOCUMENTS

| | | | |
|---|---|---|---|
| 4,436,577 A | 3/1984 | Frederick et al. | |
| 4,592,895 A | 6/1986 | Matsutani et al. | |
| 4,617,173 A | 10/1986 | Latka | |
| 4,659,423 A | 4/1987 | Kim et al. | |
| 4,830,703 A | 5/1989 | Matsutani | |
| 4,849,188 A | 7/1989 | Takasu et al. | |
| 5,137,699 A | 8/1992 | Azad | |
| 5,178,720 A | 1/1993 | Frederick | |
| 5,653,799 A | 8/1997 | Fuerhoff | |
| 5,665,159 A | 9/1997 | Fuerhoff | |
| 5,733,371 A | 3/1998 | Hashio et al. | |
| 5,766,341 A | 6/1998 | Kimbel et al. | |
| 5,846,318 A | 12/1998 | Javidi | |

(Continued)

FOREIGN PATENT DOCUMENTS

EP        0194051 A1    9/1986

(Continued)

OTHER PUBLICATIONS

Watanabe et al., "Flow and Temperature Field in Molten Silicon During Czochralski Crystal Growth in a Cusp Magnetic Field," Journal of Crystal Growth, Oct. 1, 1998, pp. 402-412, vol. 193, No. 3, Amsterdam, NL.

(Continued)

*Primary Examiner*—Felisa C Hiteshew
(74) *Attorney, Agent, or Firm*—Senniger Powers LLP

(57) ABSTRACT

System for controlling crystal growth in a Czochralski crystal growing apparatus. A magnetic field is applied within the crystal growing apparatus and varied to control a shape of the melt-solid interface where the ingot is being pulled from the melt. The shape of the melt-solid interface is formed to a desired shape in response to the varied magnetic field as a function of a length of the ingot.

20 Claims, 20 Drawing Sheets

U.S. PATENT DOCUMENTS

| | | | |
|---|---|---|---|
| 5,871,578 | A | 2/1999 | Lino et al. |
| 5,882,402 | A | 3/1999 | Fuerhoff |
| 5,911,823 | A | 6/1999 | Sonoda et al. |
| 6,159,438 | A | 12/2000 | Iida et al. |
| 6,190,452 | B1 | 2/2001 | Sakurada et al. |
| 6,364,947 | B1 | 4/2002 | Iida et al. |
| 6,458,204 | B1 | 10/2002 | Okui et al. |
| 6,514,335 | B1 | 2/2003 | Egashira et al. |
| 6,535,092 | B1 | 3/2003 | Hurley et al. |
| 6,702,892 | B2 | 3/2004 | Okui et al. |
| 7,000,408 | B2 * | 2/2006 | Mitsubori ............... 62/6 |
| 7,125,450 | B2 | 10/2006 | Lu et al. |
| 7,223,304 | B2 * | 5/2007 | Lu ............... 117/30 |
| 7,291,221 | B2 * | 11/2007 | Korb ............... 117/30 |
| 2003/0041796 | A1 | 3/2003 | Nakamura et al. |
| 2004/0040491 | A1 | 3/2004 | Murakami et al. |
| 2004/0118333 | A1 | 6/2004 | Lu et al. |

FOREIGN PATENT DOCUMENTS

| | | | |
|---|---|---|---|
| EP | 0247297 | A | 12/1987 |
| EP | 0732427 | A | 9/1996 |
| EP | 0890662 | A | 1/1999 |
| JP | 60011297 | | 1/1985 |
| WO | 8908731 | A1 | 9/1989 |
| WO | 0022201 | A | 4/2000 |

OTHER PUBLICATIONS

Hirata et al., "Homogeneous Increase in Oxygen Concentration in Czochralski Silicon Crystal by a Cusp Magnetic Field," Journal of Crystal Growth, Dec. 1, 1989, pp. 777-781, vol. 98, No. 4, Amsterdam, NL.

Dulikravich et al., "Proceedings of the SPIE", The International Society for Optical Engineering, 1993, pp. 65-75, vol. 1916.

T. Mori, Ph.D., "Modeling the Linkages between Heat Transfer and Microdefect Formation in Crystal Growth: Examples of Czochralski Growth of Silicon and Vertical Bridgman Growth of Bismuth Germanate," Thesis, Massachusetts Institute of Technology, 2000, pp. 225-258.

Dulikravich et al., "Three-Dimensional Control of Crystal Growth Using Magnetic Fields," 1993, SPIE vol. 1916, pp. 65-75.

* cited by examiner

CONTROLLING MELT-SOLID INTERFACE SHAPE OF A GROWING SILICON CRYSTAL USING A VARIABLE MAGNETIC FIELD

CROSS-REFERENCE TO RELATED APPLICATION

This application is a divisional of U.S. patent application Ser. No. 11/026,780, filed Dec. 30, 2004, the entire contents of which are incorporated herein by reference.

TECHNICAL FIELD

Embodiments of the present invention relate to the field of producing single crystal silicon used in the manufacture of electronic components. In particular, embodiments of the invention relate to controlling the melt-solid interface shape of a growing crystal by applying a variable magnetic field.

BACKGROUND OF THE INVENTION

Single crystal silicon, which is the starting material in most processes for fabricating semiconductor electronic components, is commonly prepared according to the so-called Czochralski process. In this process, polycrystalline silicon, or polysilicon, is charged to a crucible and melted, a seed crystal is brought into contact with the molten silicon, and a single crystal ingot is grown by relatively slow extraction. After formation of a neck is complete, decreasing the pulling rate and/or the melt temperature enlarges the diameter of the crystal until a desired or target diameter is reached. The generally cylindrical main body of the crystal, which has an approximately constant diameter, is then grown by controlling the pull rate and the melt temperature while compensating for the decreasing melt level. Near the end of the growth process but before the crucible is emptied of molten silicon, the crystal diameter is gradually reduced to form an end-cone. Typically, increasing the crystal pull rate and heat supplied to the crucible forms the end-cone. When the diameter becomes small enough, the crystal is then separated from the melt.

As in known in the art, molten silicon (at about 1420 degrees Celsius (° C.)) will dissolve the surface of a silica ($SiO_2$) crucible containing the melt. Some of the dissolved silica evaporates from the surface of the melt as SiO (silicon monoxide) while some of the dissolved silica becomes incorporated into the growing crystal. The remainder of the dissolved silica remains in the melt. In this manner, the crucible containing the silicon melt acts as a source of oxygen that is found in silicon crystals grown by the conventional Czochralski technique.

Oxygen in the silicon crystal may have both favorable and unfavorable effects. In the various heat treatment processes during the manufacture of various electrical devices, the oxygen in the crystal may cause crystal defects such as precipitates, dislocation loops, and stacking faults or it may cause electrically active defects resulting in devices with inferior performance characteristics. The solid solution of oxygen in the crystal, however, increases the mechanical strength of silicon wafers and the crystal defects may improve the yield of conforming products by entrapping contaminants of heavy metals. Accordingly, oxygen content of the silicon crystal is an important factor for product quality that should be carefully controlled in accordance with the ultimate application for the silicon wafers.

The oxygen concentration in a conventional silicon crystal grown under Czochralski conditions prevalent in the industry varies along the length of the crystal. For example, the concentration is typically higher at the seed end than in the middle and/or at the bottom or tang end of the crystal. In addition, oxygen concentration typically varies along the radius of a cross-sectional slice of the crystal.

To address this oxygen control problem, attention has been given to the use of magnetic fields to stabilize convective flows in metal and semiconductor melts for controlling oxygen concentration and radial distribution to remove dopant striation, etc. For example, the Lorentz force generated by magnetic fields in a conductive melt may be used to dampen natural convective flow and turbulence. There are three conventional types of magnetic field configurations used to stabilize convective flows in conductive melts, namely, axial, horizontal, and cusped.

The axial (or vertical) magnetic field configuration (e.g., see FIG. 1) generates a magnetic field parallel to the crystal-growth direction. In FIG. 1, a magnet coil 21, shown in cross-section, supplies a magnetic field to a crucible 23. As shown, the crucible 23 contains a silicon melt 25 from which a crystal 27 is grown. This configuration has the advantages of relatively simple setup and axial symmetry. But the axial magnetic field configuration destroys radial uniformity due to its dominant axial field component.

In the horizontal (or transverse) magnetic field configuration (e.g., see FIG. 2), two magnetic poles 29 are placed in opposition to generate a magnetic field perpendicular to the crystal-growth direction. The horizontal configuration has the advantage of efficiency in damping a convective flow at the melt surface. But its non-uniformity both axially and radially and the complex and bulky setup make it difficult to apply the horizontal magnetic field configuration in large diameter Czochralski growth processes.

The cusped magnetic field configuration (e.g., see FIG. 3) is designed to overcome the deficiencies of the axial and horizontal magnetic field configurations. A pair of coils 31, 33 (e.g., Helmholtz coils) placed coaxially above and below a melt-solid interface and operated in an opposed current mode generates a magnetic field that has a purely radial field component near the melt surface and a purely axial field component near the center of the melt. In this manner, the cusped magnetic field configuration attempts to preserve the rotational symmetry at the interface between the melt and the crystal. However, the effectiveness of the cusped magnetic field is decreased at the center of the melt. Furthermore, since the cusp position remains at the melt surface, axial uniformity within the melt is gradually reduced and eventually disappears as the melt depth is decreased towards the end of crystal growth.

Accordingly, improved control of the crystal growth process is desired to address the disadvantages of these conventional magnetic field configurations.

SUMMARY OF THE INVENTION

Embodiments of the invention overcome one or more deficiencies in the prior art and provide control of an interface shape between a melt and a crystal by applying a variable magnetic field. In one embodiment, the invention controls flow within a silicon melt from which a crystal is growing via an asymmetric magnetic field having a configuration and field intensity that may be continuously changed. Embodiments of the invention thus allow manipulation of the crystal-to-melt interface shape, the axial temperature gradient at the interface, and the radial variation of the axial temperature gradient in the crystal at and near the interface to achieve a desired interface shape and value. According to aspects of the invention, a variable asymmetric magnetic field achieves more flexibility and capability than any of the conventional magnetic field configurations in controlling the crystal-to-melt interface shape. Moreover, an embodiment of the invention allows a cusp position of the magnetic field to be moved either above or below the crystal-to-melt interface based on a length of the crystal to maintain a desired melt flow control and uniformity. Without changing hardware setups and physical locations, the variable asymmetric magnetic field of the invention combines the benefits of the conventional magnetic field configurations while avoiding their deficiencies.

A method embodying aspects of the invention controls crystal growth in a crystal growing apparatus. The method includes applying a cusped magnetic field to a semiconductor melt from which a monocrystalline ingot is grown according to a Czochralski process. The method also includes varying the magnetic field while the ingot is being pulled from the melt to control cusp position of the magnetic field relative to a melt-solid interface between the melt and the ingot for producing a desired shape of the melt-solid interface. The desired shape of the melt-solid interface is a function of length of the ingot.

In another embodiment, a system for controlling crystal growth in a crystal growing apparatus includes first and second coils positioned near a crucible containing a semiconductor melt from which a monocrystalline ingot is grown according to a Czochralski process. The coils apply a cusped magnetic field to the melt. The system also includes a variable power supply for energizing the coils. A controller varies the power supply while the ingot is being pulled from the melt. The variable power supply is responsive to the controller for varying the magnetic field to control cusp position of the magnetic field relative to a melt-solid interface between the melt and the ingot. This produces a desired shape of the melt-solid interface. The desired shape of the melt-solid interface is a function of length of the ingot.

Yet another embodiment involves a method for producing a monocrystalline semiconductor ingot by a Czochralski process. The method includes growing a monocrystalline ingot on a seed crystal pulled from a semiconductor melt. The method also includes applying an asymmetric magnetic field to the melt while growing the ingot and varying the magnetic field, as a function of a length of the ingot, to control a shape of the melt-solid interface while the ingot is being pulled from the melt.

Another method embodying aspects of the invention controls an oxygen characteristic of crystal growth of a monocrystalline ingot. The ingot is grown in a crystal growing apparatus according to a Czochralski process. The crystal growing apparatus has a heated crucible that includes a semiconductor melt from which the ingot is grown. The ingot is grown on a seed crystal pulled from the melt. The method includes applying a cusped magnetic field to the melt. The method also includes varying the magnetic field while the ingot is being pulled from the melt to control cusp position of the magnetic field relative to a melt-solid interface between the melt and the ingot for producing a desired shape of the melt-solid interface. The desired shape of the melt-solid interface produces a desired oxygen characteristic in the ingot.

Alternatively, embodiments of the invention may comprise various other methods and apparatuses.

Other features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE INVENTION

Figure 4:
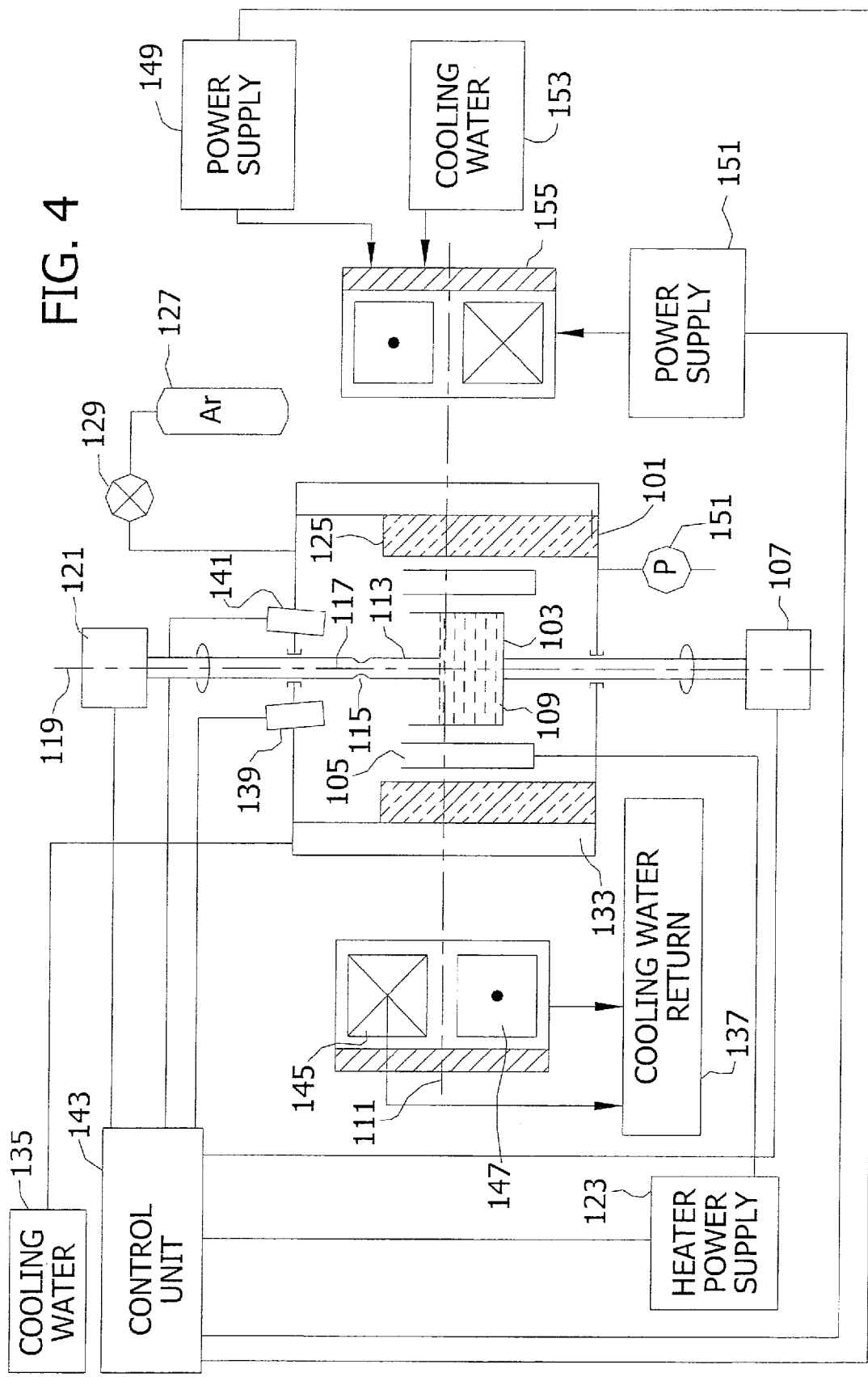
FIG. 4 is an illustration of a crystal growing apparatus and an apparatus according to an embodiment of the present invention for controlling the crystal growing apparatus.

Referring now to FIG. 4, a Czochralski crystal growth apparatus embodying aspects of the present invention is shown in block diagram form. In general, the crystal growing apparatus includes a vacuum chamber 101 enclosing a crucible 103. Heating means such as a resistance heater 105 surrounds the crucible 103. During heating and crystal pulling, a crucible drive unit (e.g., a motor) 107 rotates crucible 103, for example, in the clockwise direction as indicated by the arrow. The crucible drive unit 107 may also raise and/or lower crucible 103 as desired during the growth process. Within crucible 103 is a silicon melt 109 having a melt level 111. In operation, the apparatus pulls a single crystal 113, starting with a seed crystal 115 attached to a pull shaft or cable 117, from the melt 109. As is known in the art, one end of the pull shaft or cable 117 is connected by way of a pulley (not shown) to a drum (not shown), and the other end is connected to a chuck (not shown) that holds the seed crystal 115 and the crystal 113 grown from seed crystal 115.

The crucible 103 and single crystal 113 have a common axis of symmetry 119. Crucible drive unit 107 can raise crucible 103 along the axis 119 as the melt 109 is depleted to maintain its level 111 at a desired height. A crystal drive unit 121 similarly rotates pull shaft or cable 117 in a direction opposite the direction in which crucible drive unit 107 rotates crucible 103 (e.g., counter-rotation). In embodiments using iso-rotation, the crystal drive unit 121 may rotate pull shaft or cable 117 in the same direction in which crucible drive unit 107 rotates crucible 103 (e.g., in the clockwise direction). In addition, crystal drive unit 121 raises and lowers the crystal 113 relative to melt level 111 as desired during the growth process.

According to the Czochralski single crystal growth process, a quantity of polycrystalline silicon, or polysilicon, is charged to crucible 103. A heater power supply 123 energizes the resistance heater 105, and insulation 125 lines the inner wall of the vacuum chamber 101. A gas supply (e.g., a bottle) 127 feeds argon gas to vacuum chamber 101 via a gas flow controller 129 as a vacuum pump 131 removes gas from vacuum chamber 101. A chamber cooling jacket 133, which is fed with cooling water from a reservoir 135, surrounds vacuum chamber. The cooling water is then drained to a cooling water return manifold 137. Typically, a temperature sensor such as a photocell 139 (or pyrometer) measures the temperature of melt 109 at its surface, and a diameter transducer 141 measures the diameter of single crystal 113. A processor such as a control unit 143 processes the signals generated by the photocell 139 and the diameter transducer 141. The control unit 143 may be a programmed digital or analog computer; it controls crucible and single crystal drive units 107 and 121, heater power supply 123, pump 131, and argon flow controller 129.

As shown in FIG. 4, an upper magnet, such as a solenoid coil 145, and a lower magnet, such as a solenoid coil 147, may be located above and below, respectively, melt level 111. In the illustrated embodiment, the coils 145, 147, shown in cross-section, surround vacuum chamber 101 and share axes with axis of symmetry 119. The upper and lower coils 145, 147 have separate power supplies, namely, an upper coil power supply 149 and a lower coil power supply 151, each of which is connected to and controlled by control unit 143.

According to embodiments of the invention, current flows in opposite directions in the two solenoid coils 145, 147 to produce a magnetic field. A reservoir 153 provides cooling water to the upper and lower coils 145, 147 before draining via cooling water return manifold 137. A ferrous shield 155 surrounds coils 145, 147 in the illustrated embodiment to reduce stray magnetic field and to enhance the strength of the field produced.

Embodiments of the invention involve producing silicon crystal ingots suitable for use in device manufacturing. Advantageously, the present invention may be used to produce silicon crystal 113, a substantial portion or all of which is substantially free of agglomerated intrinsic point defects. That is, a substantial portion or all of crystal 113 produced by embodiments of the invention may have a density of defects of less than about $1\times10^4$ defects/cm$^3$, less than about $5\times10^3$ defects/cm$^3$, less than about $1\times10^3$ defects/cm$^3$, or even no detectable agglomerated intrinsic point defects. In further embodiments, the present invention may be used to produce crystal 113 having substantially no agglomerated defects that are larger than about 60 nm in diameter.

Figure 5A:
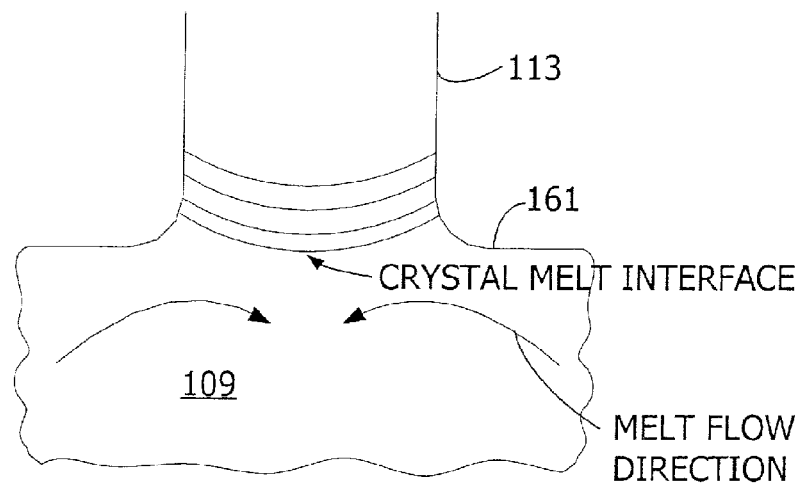
FIG. 5A is an illustration of an exemplary melt-solid interface having a generally convex shape relative to an ingot.
Figure 5B:
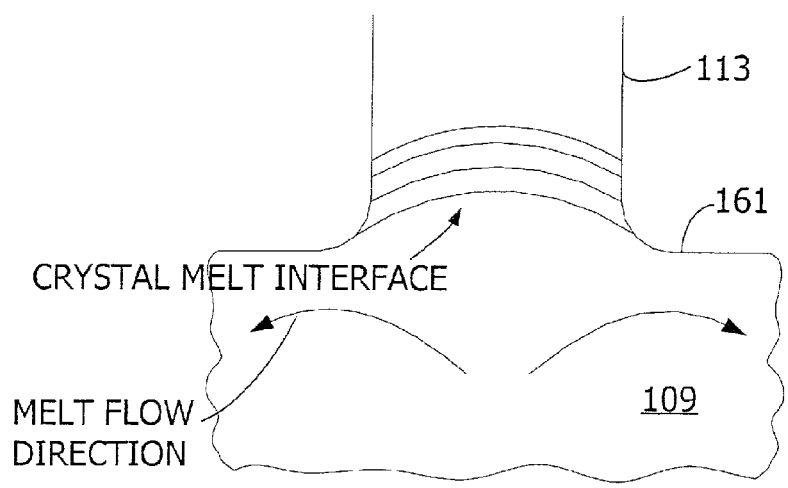
FIG. 5B is an illustration of an exemplary melt-solid interface having a generally concave shape relative to an ingot.
Figure 5C:
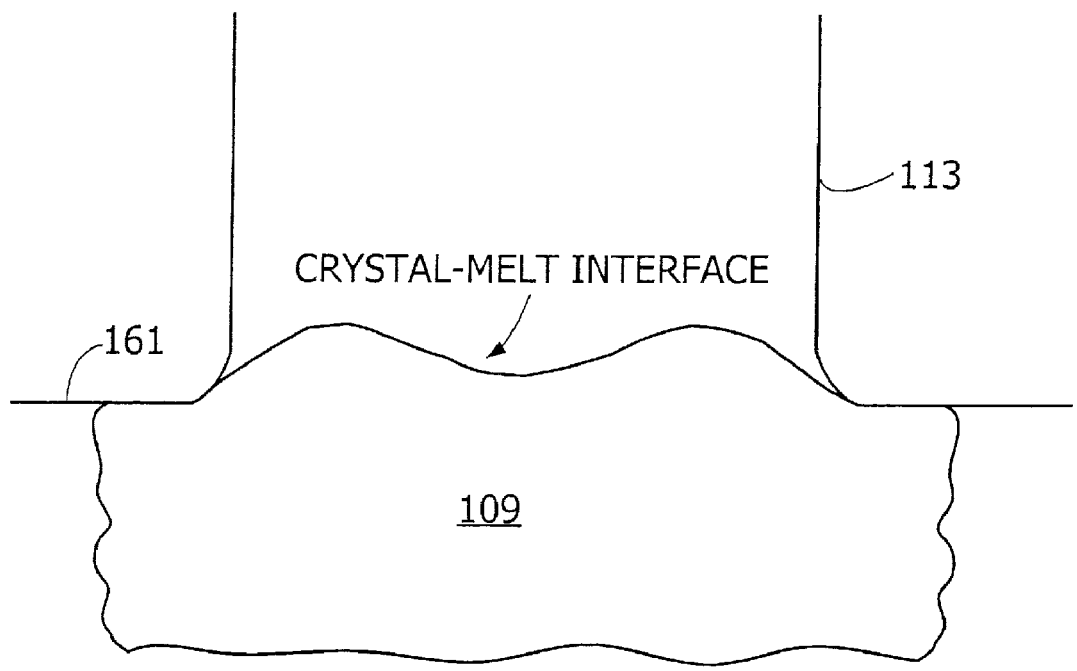
FIG. 5C is an illustration of an exemplary melt-solid interface having a generally gull-wing shape.

Aspects of the present invention control the shape of the melt-solid or melt-crystal interface during crystal growth to limit and/or suppress the formation of agglomerated intrinsic point defects. FIG. 5 shows an exemplary melt-crystal interface, including melt surface 161. The shape of this interface between melt 109 and silicon crystal 113 may be concave or convex in shape relative to the crystal 113. The melt-solid interface shape may even be both concave and convex in shape relative to crystal 113 (e.g., a "gull-wing" shape). As described below, the melt-solid interface shape is an important parameter for controlling defects during crystal growth.

In one embodiment, the present invention employs melt convection to affect the melt-solid interface shape. Convection refers to the process of heat transfer in a liquid by the movement of the liquid itself. In general, there are two types of convection: natural convention and forced convection. Natural convection occurs when the movement of melt 109 is due, for example, to the presence of heaters 105 giving rise to density gradients. Forced convection occurs when the movement of the melt 109 is due to an external agent such as a magnetic field in crucible 103. Accordingly, controlling the magnetic field intensity may produce a desired melt-solid interface shape.

For instance, because a magnetic field may affect the flow pattern in electrically conducting fluids such as silicon melt 109, an embodiment of the invention uses a magnet (e.g., in the form of coils 145, 147) to affect melt convection and thus change the temperature distribution in the melt 109, which in turn affects the melt-solid interface shape. As described below, embodiments of the invention further control the flow of silicon melt 109 via an axially asymmetric magnetic field whose configuration and field intensity may be continuously changed. As such, the melt-solid interface shape, the axial temperature gradient at the interface, and the radial variation of the axial temperature gradient in crystal 113 at and near the interface may be manipulated to produce a desired interface shape and value. As described in detail below with reference to FIG. 6A, FIG. 7A, and FIG. 8, embodiments of the present invention provide variable magnetic fields within the crystal growing apparatus for producing desired melt-solid interface shapes, which in turn produce desired crystal characteristics.

As is known to those skilled in the art, a silicon crystal grown from a melt may have an excess of crystal lattice vacancies ("V") or silicon self-interstitials ("I"). According to embodiments of the present invention, manipulation of a melt-solid interface shape during the growth of the crystal can be used to control the initial distribution of point defects at the solidification front and the diffusion path of point defects at various degrees from the melt-solid interface. The dominant point defect type is generally determined near solidification. Therefore, if the dominant point defect concentration reaches a level of critical super-saturation and if the mobility of the point defect is sufficiently high, a reaction or an agglomeration event is likely to occur. Agglomerated intrinsic point defects in silicon may affect the yield potential of the material in the production of complex and highly integrated circuits. By controlling the melt-solid interface shape, embodiments of the invention reduce or avoid the agglomeration reaction to produce silicon that is substantially free of agglomerated intrinsic point defects.

The ratio of the pull rate v of a crystal to an axial temperature gradient G indicates the type of intrinsic point defect likely to occur in the growing crystal. For example, when the pull rate is high, lattice vacancies are generally the dominant point defects. Alternatively, when the pull rate is low, silicon self-interstitials are generally the dominant point defects. Thus, during a dynamic growth process (i.e., where v/G may vary as a function of the radius and/or axial length of the crystal), point defects within the growing silicon crystal may change from being vacancy dominated to interstitial dominated, or vice versa. Moreover, an identifiable vacancies/self-interstitials (V/I) transition is associated with such a change. A defect free region may exist between agglomerated vacancy defects and agglomerated interstitial type defects. Specifically, the V/I transition occurs within this defect-free region. That is, this defect-free region corresponds to the transition region from an excess vacancy dominant region to an excess interstitial dominant region. The defect-free region may be vacancy dominated and/or interstitial dominated material. The defect-free region does not include critical excess point defects to form any defects and generally includes the V/I transition.

When the identified V/I transition has a particular shape as provided herein, crystal 113 is substantially free of agglomerated defects at this transition. For instance, a substantially flat V/I transition perpendicular to the pull axis 119 under dynamic growth simulations corresponds to a portion of crystal 113 substantially free of agglomerated defects. Therefore, controlling a melt-solid interface shape produces improvements in substantially defect-free single silicon crystal. In particular, by controlling the melt-solid interface shape according to a target melt-solid interface shape as a function of axial length, embodiments of the invention can produce a region substantially free of agglomerated defects in crystal 113.

The target interface shape is unique to the crystal hot zone design and the position along the axial length of the crystal 113. Accordingly, the target interface shape is determined for a particular hot zone at various positions along the length of crystal 113. Rather than limiting the rate at which such defects form or attempting to annihilate some of the defects after they have formed, suppressing or otherwise controlling the agglomeration reactions yields a silicon substrate that is substantially free of undesirable amounts or sizes of agglomerated intrinsic point defects. Suppressing or controlling the agglomeration reactions also affords single crystal silicon wafers having an epi-like yield potential in terms of the number of integrated circuits obtained per wafer and without having the high costs associated with an epitaxial process.

By affecting the melt-solid interface shape, a magnetic field imposed upon melt 109 in accordance with embodiments of the invention can regulate the oxygen concentration in the axial and radial directions for single crystal ingots of relatively large diameter, particularly at relatively low oxygen concentrations. Current is permeated through the upper and lower coils 145, 147 as indicated (the "•" indicating the flow of current out of the page and the "X" indicating the flow of current into the page), thereby causing a magnetic field to be imposed upon crucible 103 and silicon melt 109. The magnetic field has horizontal and vertical components that perpendicularly intersect the bottom and sidewalls of crucible 103. In addition, the magnetic field may have a vertical component that perpendicularly intersects silicon melt surface 161. The average magnetic component that perpendicularly intersects molten silicon surface 161 may be small relative to the average magnetic component perpendicularly intersecting the bottom and sidewalls of crucible 103 in contact with melt 109. That is, the average magnetic component that perpendicularly intersects melt surface 161 may be no greater than about one-tenth of the average magnetic component perpendicularly intersecting the bottom and side walls of crucible 103 in contact with the molten silicon of melt 109. Moreover, the average magnetic component perpendicularly intersecting melt surface 161 may be at or near zero. That is, the magnetic field null plane is located at or near silicon melt level 111. Vertical position, the number of turns, and the relative current in the two coils 145, 147 may position the null magnetic field at or near the plane of melt level 111.

Figure 1:
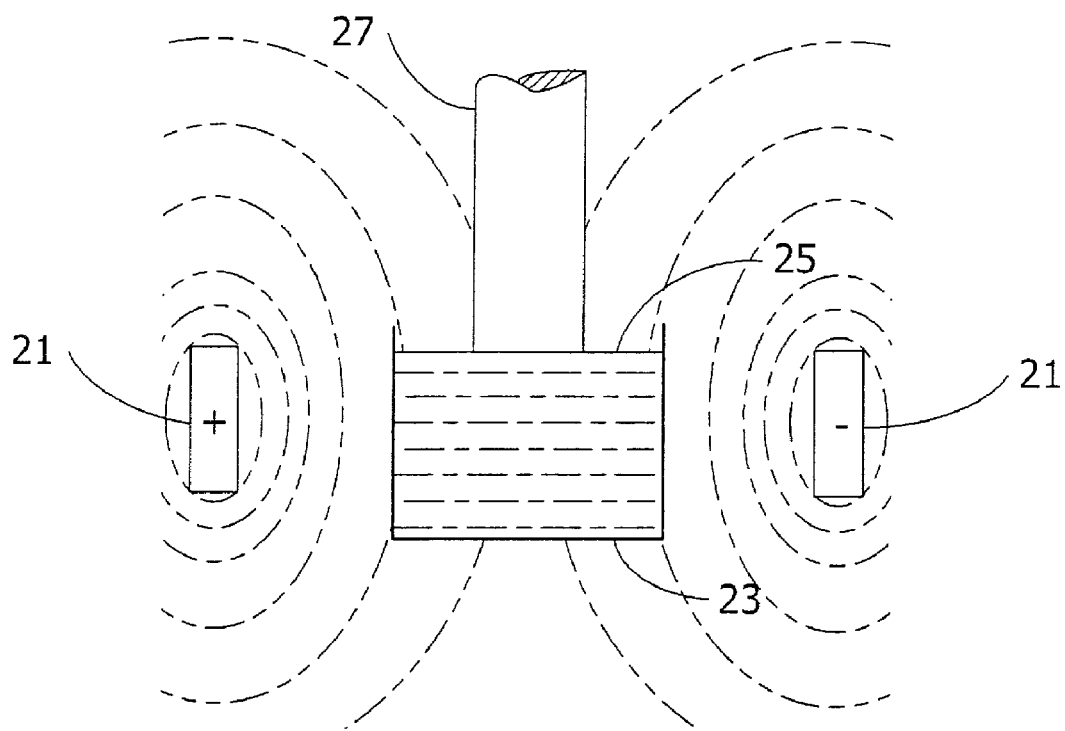
FIG. 1 is a block diagram illustrating an axial magnetic field to a crystal growing apparatus according to the prior art.
Figure 2:
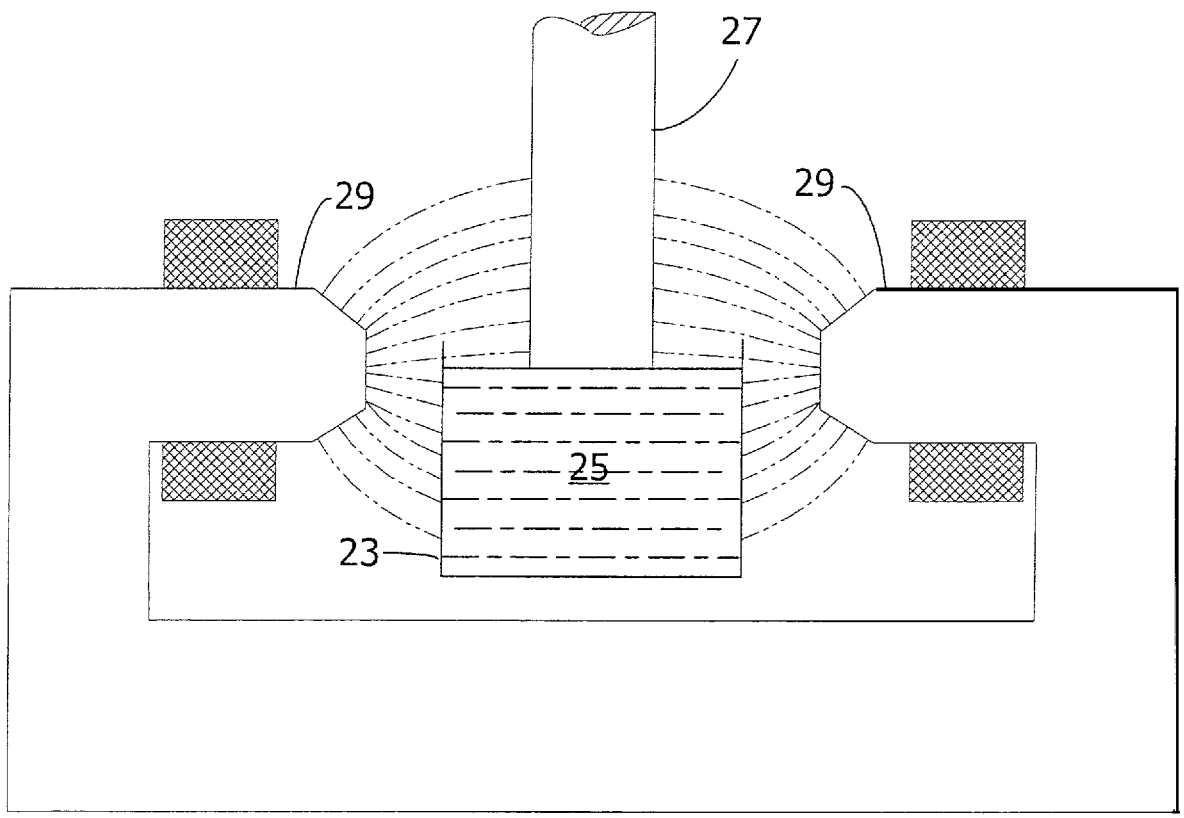
FIG. 2 is a block diagram illustrating a horizontal magnetic field to a crystal growing apparatus according to the prior art.
Figure 3:
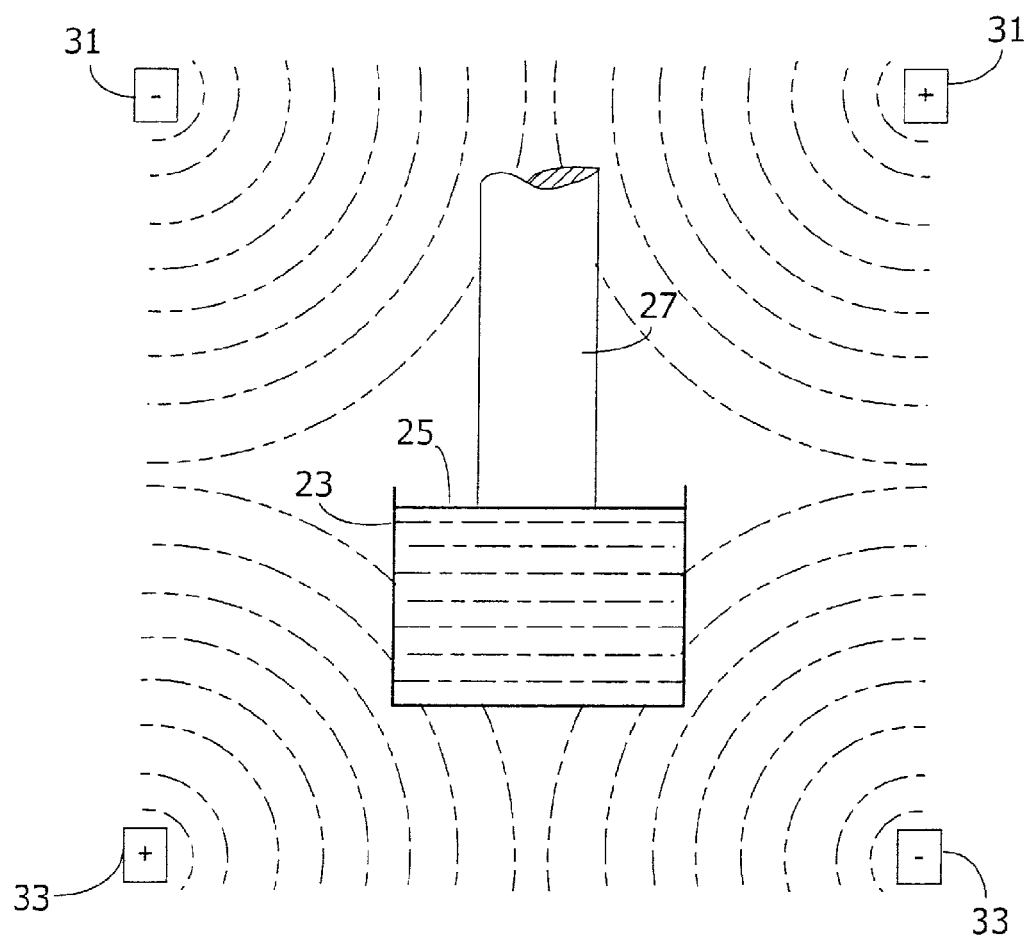
FIG. 3 is a block diagram illustrating a cusped magnetic field to a crystal growing apparatus according to the prior art.

Embodiments of the invention provide a variable asymmetric magnetic field configuration (see FIG. 6A and FIG. 7A) that advantageously uses the same hardware setup as the cusped magnetic field configuration (see FIG. 3). According to one embodiment, control unit 143 (i.e., a controller) controls upper and lower coil power supplies 149 and 151 to adjust the power distribution of upper and lower coils 145 and 147 such that an axially asymmetric field intensity generated in upper and lower coils 145 and 147 moves a cusp position to above or below melt level 111 (e.g., at a melt-solid interface). Control unit 143 may further control upper and lower coil power supplies 149 and 151 to impose different asymmetric field configurations upon the melt-solid interface such that an axially dominated asymmetric field configuration, horizontally dominated asymmetric field configuration, or symmetric field configuration (e.g., cusped magnetic field configuration) may be achieved at any crystal length. Therefore, embodiments of the invention provide the desired melt flow control and melt flow uniformity at the same time with improved efficiency, flexibility, and capability that combine the benefits from the three conventional magnetic field configurations while avoiding their deficiencies.

To move the cusp position up and down and to change the degree (or magnitude) of axial or horizontal field domination, control unit 143 adjusts upper and lower coil power supplies 149 and 151 to change the power distributions in upper and lower coils 145 and 147. In an embodiment of the invention, upper and lower coils 145 and 147 are made such that when using the same power distribution (e.g., both at the same percentage of the maximum power input), the cusp position remains at melt surface 111 (e.g., the melt-solid interface). Using the maximum power input typically enables a single coil (e.g., upper coil 145 or lower coil 147) to generate a magnetic field of a few hundreds to a couple of thousand gauss depending on the size of the coil.

According to embodiments of the invention, control unit 143 is configured to move the cusp position to above or below melt level 111 with variable distance by adjusting the difference of power distributions to upper and lower coils 145 and 147 (e.g., via upper and lower coil power supplies 149 and 151). Control unit 143 is also configured to adjust the variable distance above or below melt level 111 as a function of time or crystal length so that the variable cusp position varies accordingly at different crystal growth stages and different crystal lengths.

In the crystal pulling process, current is permeated through coils 145, 147 to impose a magnetic field upon silicon melt 109 and crucible 103 having a predetermined intensity. The predetermined intensity varies depending upon the diameter of crystal 113, the diameter of crucible 103, the amount of the polysilicon charge, and the desired oxygen content. In general, the invention involves a magnetic field having a maximum predetermined intensity of, for example, less than several thousand gauss such as between about 400 and 2000 gauss. As the length of crystal 113 increases (i.e., as the fraction of the molten charge solidified increases), control unit 143 decreases the intensity of the field by reducing the amount of current permeated through the coils (e.g., by controlling upper and lower coil power supplies 149 and 151), by moving the coils relative to crucible 103, or by moving or eliminating a magnetic shielding.

As control unit 143 decreases the intensity of the magnetic field, the magnetic field components that perpendicularly intersect the bottom and side walls of crucible 103 is reduced. But because the null plane of the magnetic field remains at or near silicon melt surface 161, the ratio between the average magnetic field component that perpendicularly intersects silicon melt surface 161 and the average magnetic field component that perpendicularly intersects the bottom and side walls of crucible 103 in contact with the molten silicon of melt 109 may not change.

Depending upon such parameters as single crystal nominal diameter, crystal length, crucible diameter, charge size, and magnetic field characteristics, control unit 143 controls upper and lower coil power supplies 149 and 151 to increase or decrease the strength of the magnetic field imposed on melt 109. For example, control unit 143 may control upper and lower coil power supplies 149 and 151 to adjust the intensity of the magnetic field to some value less than its initial level as the length of crystal 113 increases and the fraction of the molten charge solidified increases. Control unit 143 may also completely turn off the magnetic field after a predetermined fraction of the molten charge is frozen. In one embodiment, control unit 143 turns off the magnetic field after approximately 50% to 80% of the molten charge is frozen. Thereafter, control unit 143 may further regulate the oxygen content by increasing a crucible rotation rate relative to a single crystal rotation rate.

In one embodiment of the invention, maintaining the melt-solid interface shape within a certain range or percentage of a height deviation ratio (HDR) by controlling magnetic field intensity is desired. The HDR is determined from the following equation:

$$\text{HDR} = [H_c - H_e]/\text{Radius} \times 100,$$

where $H_c$ is the height of the crystal center from melt level 111 and $H_e$ is the height of the crystal edge from melt level 111. For example, one embodiment of the invention controls the melt-solid interface for a 200 millimeter (mm) crystal such that the HDR between the crystal center and the crystal edge is about plus or minus 11%, 9%, 7%, or 5%. For crystals having a diameter other than 200 mm, the maximum HDR can be gradually decreased by a slope of about −0.06 by the crystal radius.

Embodiments of the invention may be used to control oxygen concentration in single crystals having relatively low oxygen concentration (e.g., less than parts per million atoms (PPMA) oxygen). These single crystal ingots may have an oxygen gradient of less than 5% in the radial direction and less than 5% to 10% in the axial direction.

As a specific example, embodiments of the invention may be utilized to improve the capabilities of the 200 mm silicon wafer manufacturing process. This manufacturing process typically relies on the following strategies. First, a crystal are grown at $(v/G)_s$ close to but slight lower than $(v/G)_c$, which is the critical value of $(v/G)_s$, so that the crystal is slightly interstitial rich. The temperature of the crystal is then maintained at above 900° C., which is the nucleation temperature of interstitial defects, to promote the diffusion and thus annihilation of vacancies and interstitials. After the crystal growth, the crystal is quenched by moving it into an upper chamber to suppress the defect nucleation and growth. Typically, it is desirable to have a higher axial temperature gradient at the melt-solid interface so that a good silicon quality may be achieved at a higher pull rate and thus at a higher throughput. However, due to the limitation of hot zone, a higher axial temperature gradient may come with a higher radial variation of the axial temperature gradient in the crystal at and near the melt-solid interface. The higher variation of the axial temperature gradient may then reduce the uniformity of $(v/G)_s$ in the crystal. Sometimes, efforts to increase the axial temperature gradient cause the variation to increase and thus generate coexistence of V and I defects.

Figure 6A:
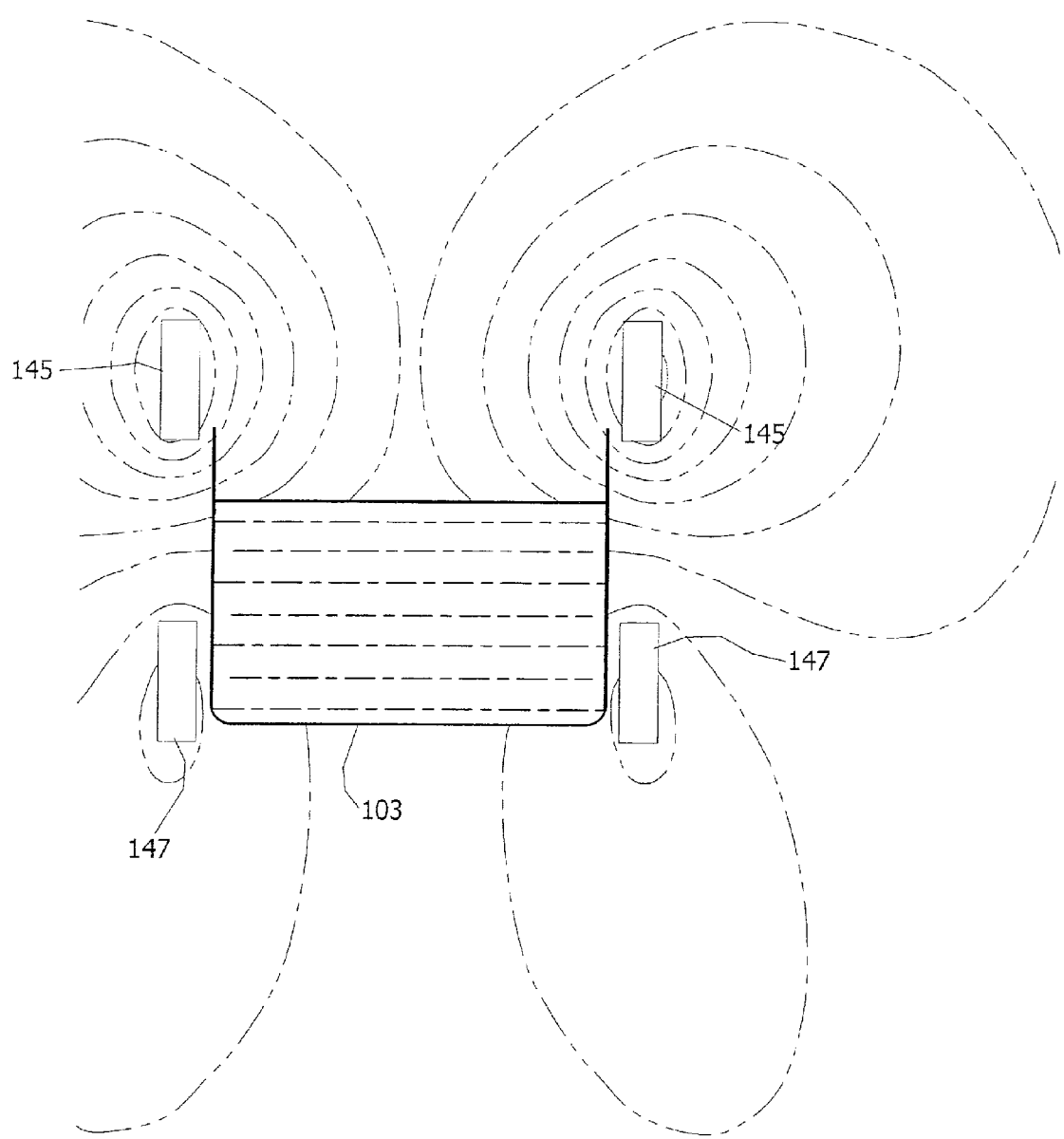
FIG. 6A is a block diagram illustrating a horizontally dominated asymmetric magnetic field according to one embodiment of the invention.
Figure 6B:
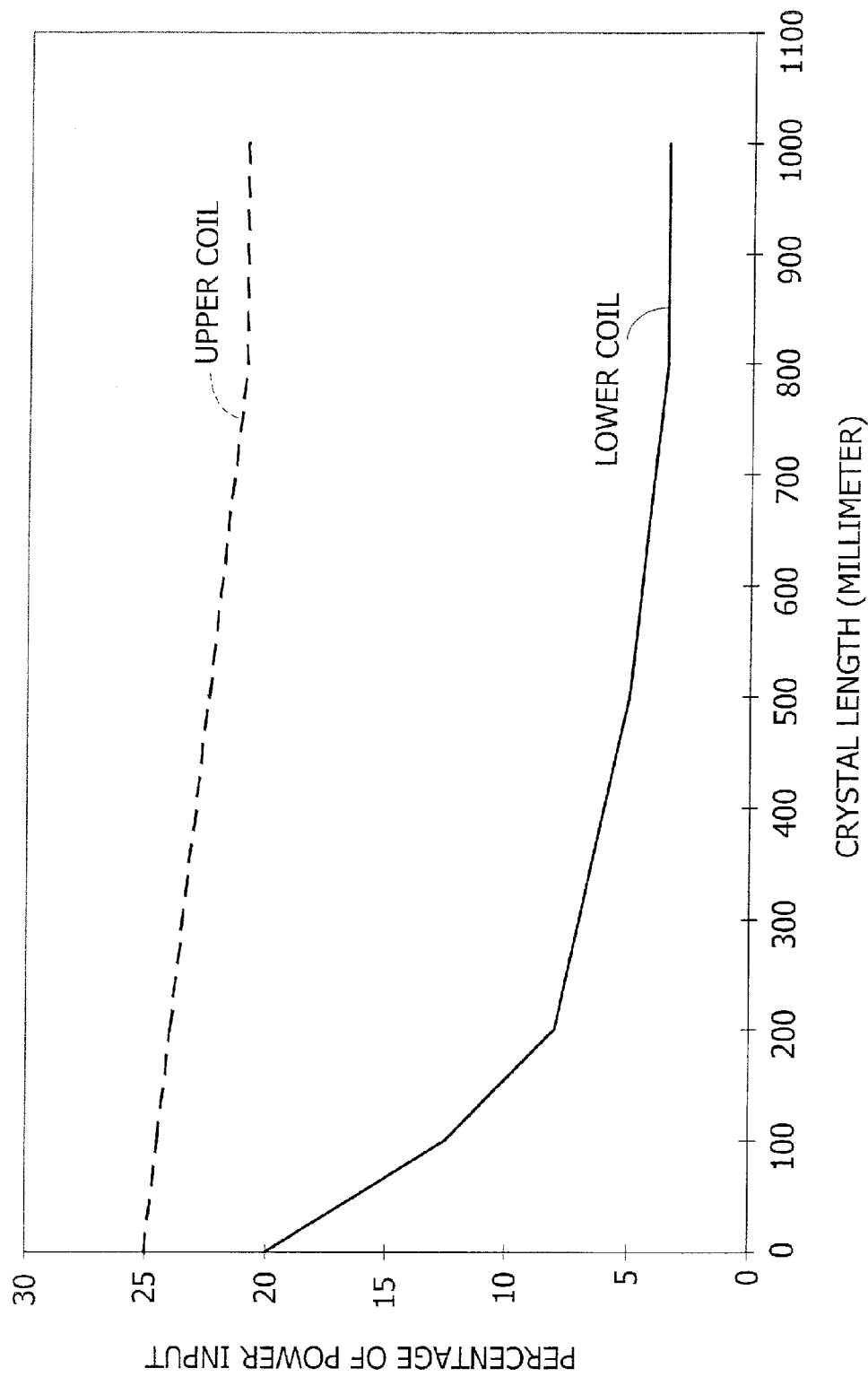
FIG. 6B is an exemplary graph illustrating a power distribution in a horizontally dominated asymmetric magnetic field according to one embodiment of the invention.
Figure 6C:
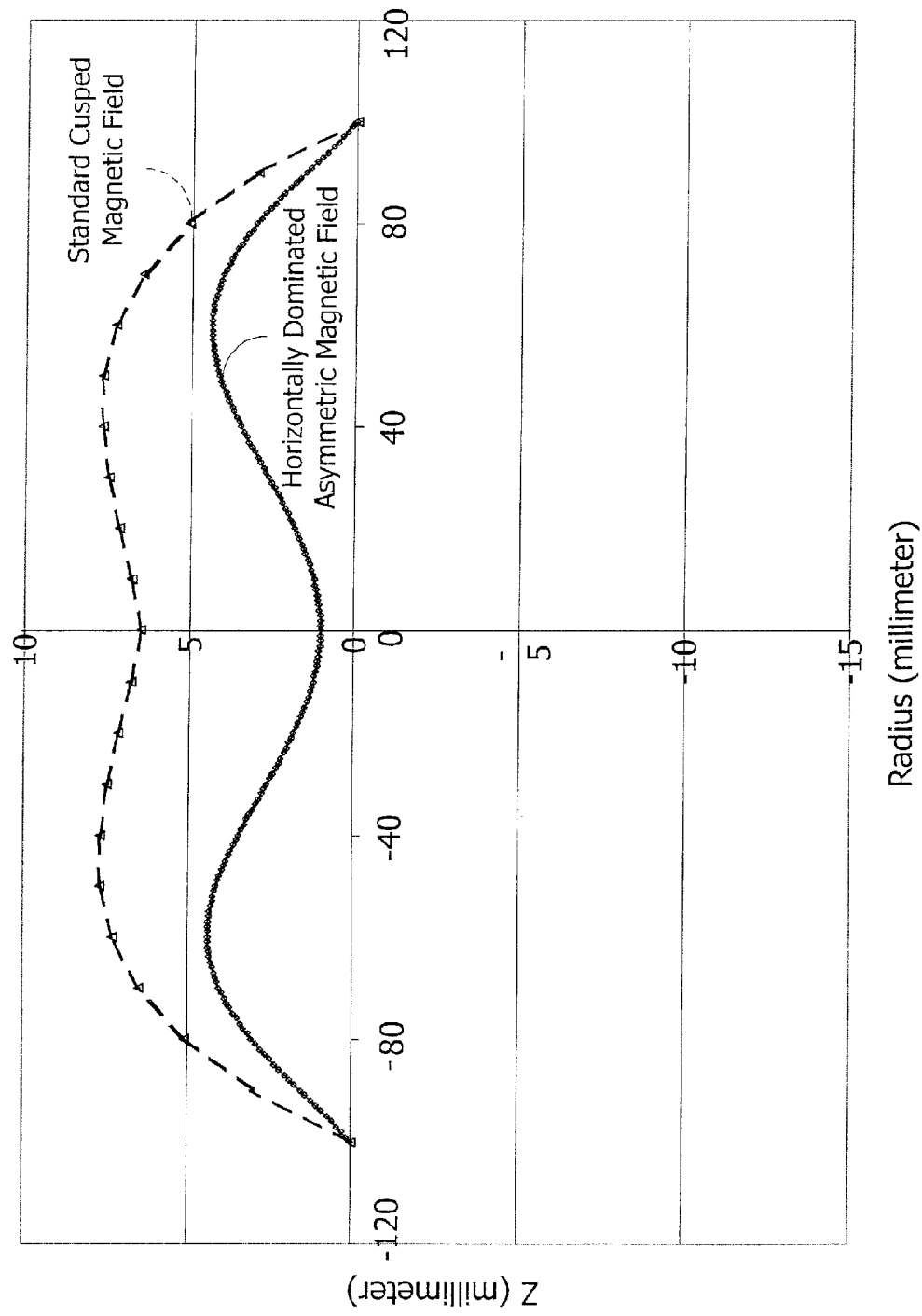
FIG. 6C is an exemplary graph illustrating melt-solid interface shapes generated by a horizontally dominated asymmetric field according to one embodiment of the invention compared to melt-solid interface shapes generated by a conventional cusped magnetic field.

Embodiments of the invention may be used to solve this problem. For example, control unit 143 may apply a higher power distribution in upper coil 145 than in lower coil 147 such that the asymmetric magnetic field moves the cusp position to below melt level 111 to generate a horizontally dominated asymmetric magnetic field at melt surface 161, as shown in FIG. 6A. This field condition leads to a less concave-shaped and more gull-wing shaped melt-solid interface, which has a higher axial temperature gradient and a flatter radial variation of the axial temperature gradient in crystal 113 at and near the melt-solid interface. FIG. 6B shows an exemplary graph illustrating the power distribution in a horizontally dominated asymmetric magnetic field. Particularly, FIG. 6B illustrates changes in percentage of power input for both upper and lower coils 145, 147 as a function of changes in crystal length. FIG. 6C shows an exemplary graph illustrating the difference between melt-solid interface shapes generated by a horizontally dominated asymmetric magnetic field and a standard cusped magnetic field. As may be seen, the melt-solid interface shape generated by the horizontally dominated asymmetric magnetic field has been adjusted toward a desired direction.

Figure 7A:
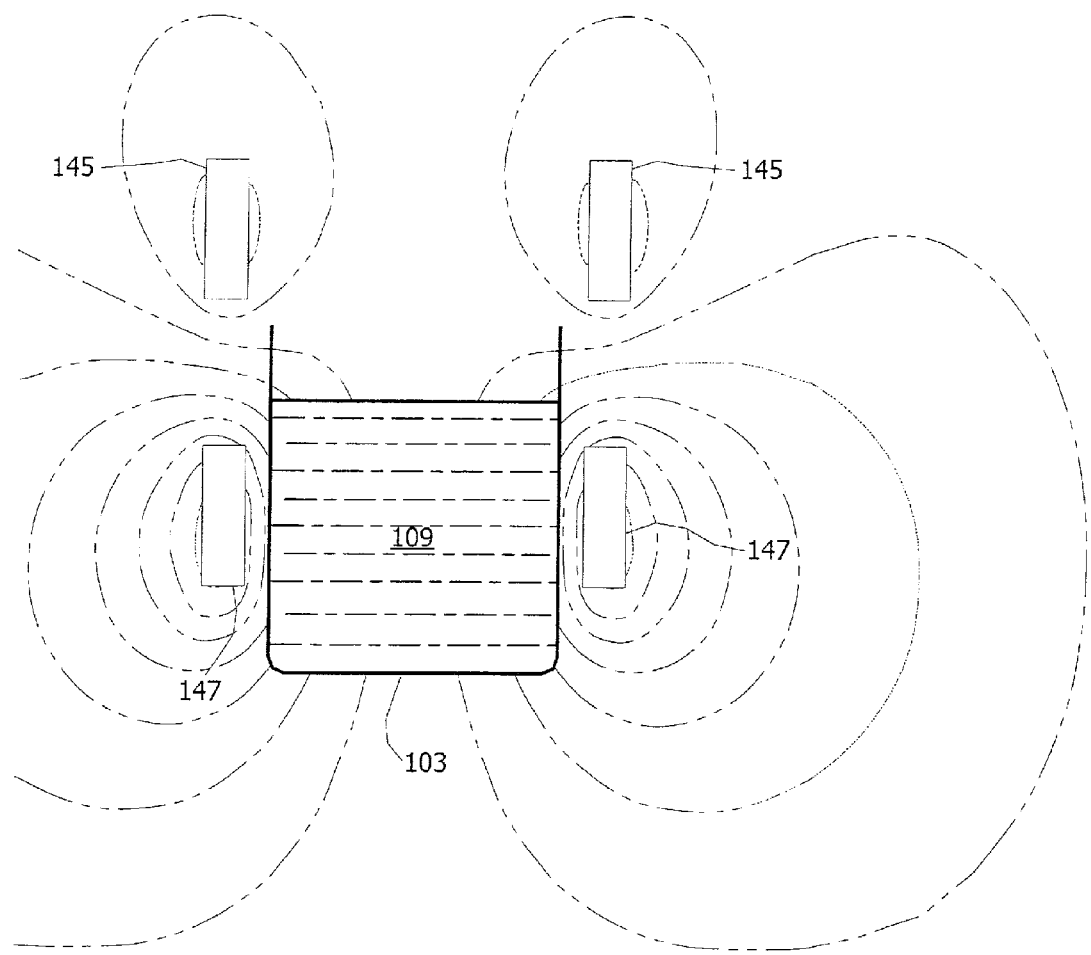
FIG. 7A is a block diagram illustrating an axially dominated asymmetric magnetic field according to one embodiment of the invention.
Figure 7B:
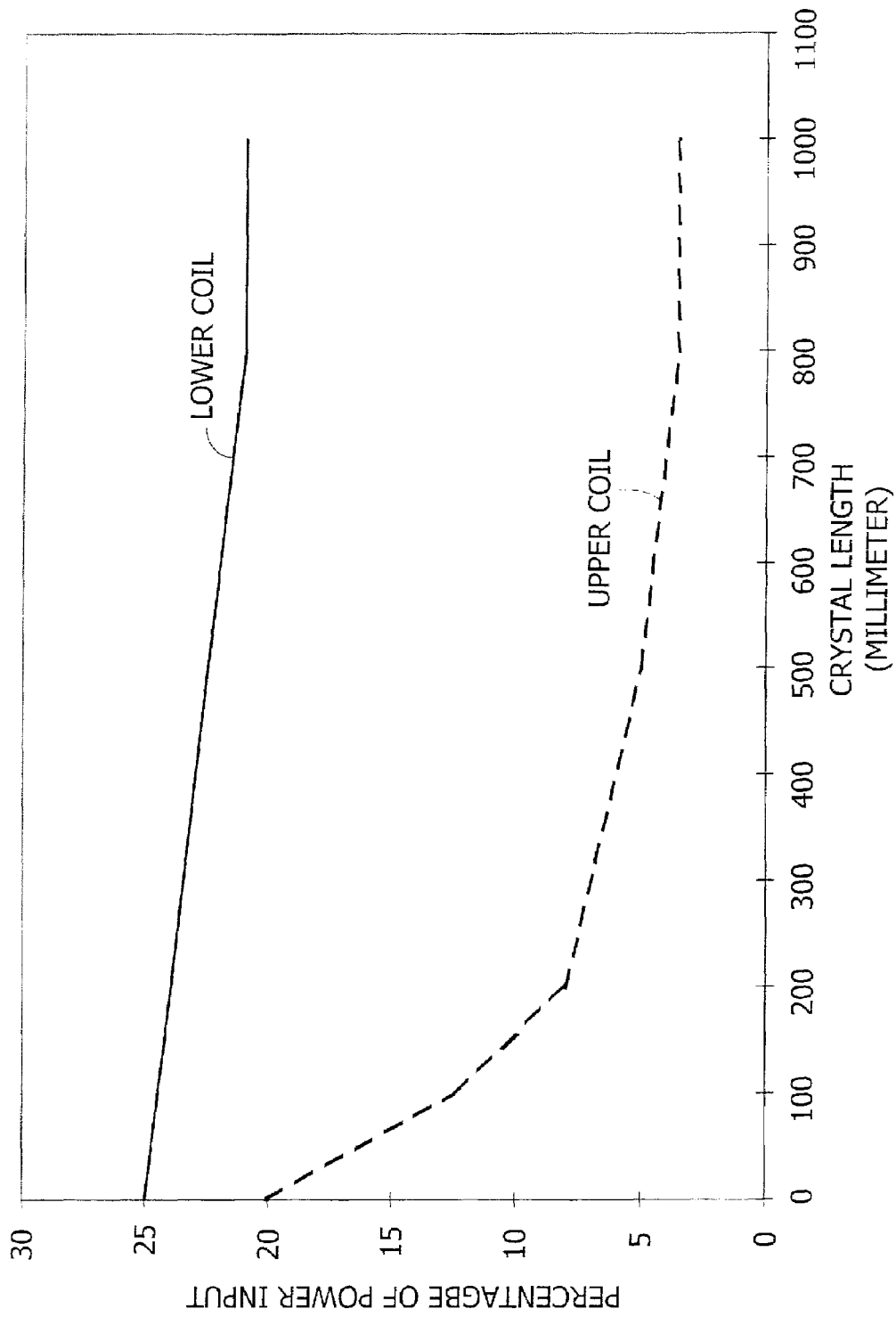
FIG. 7B is an exemplary graph illustrating a power distribution in an axially dominated asymmetric magnetic field according to one embodiment of the invention.
Figure 7C:
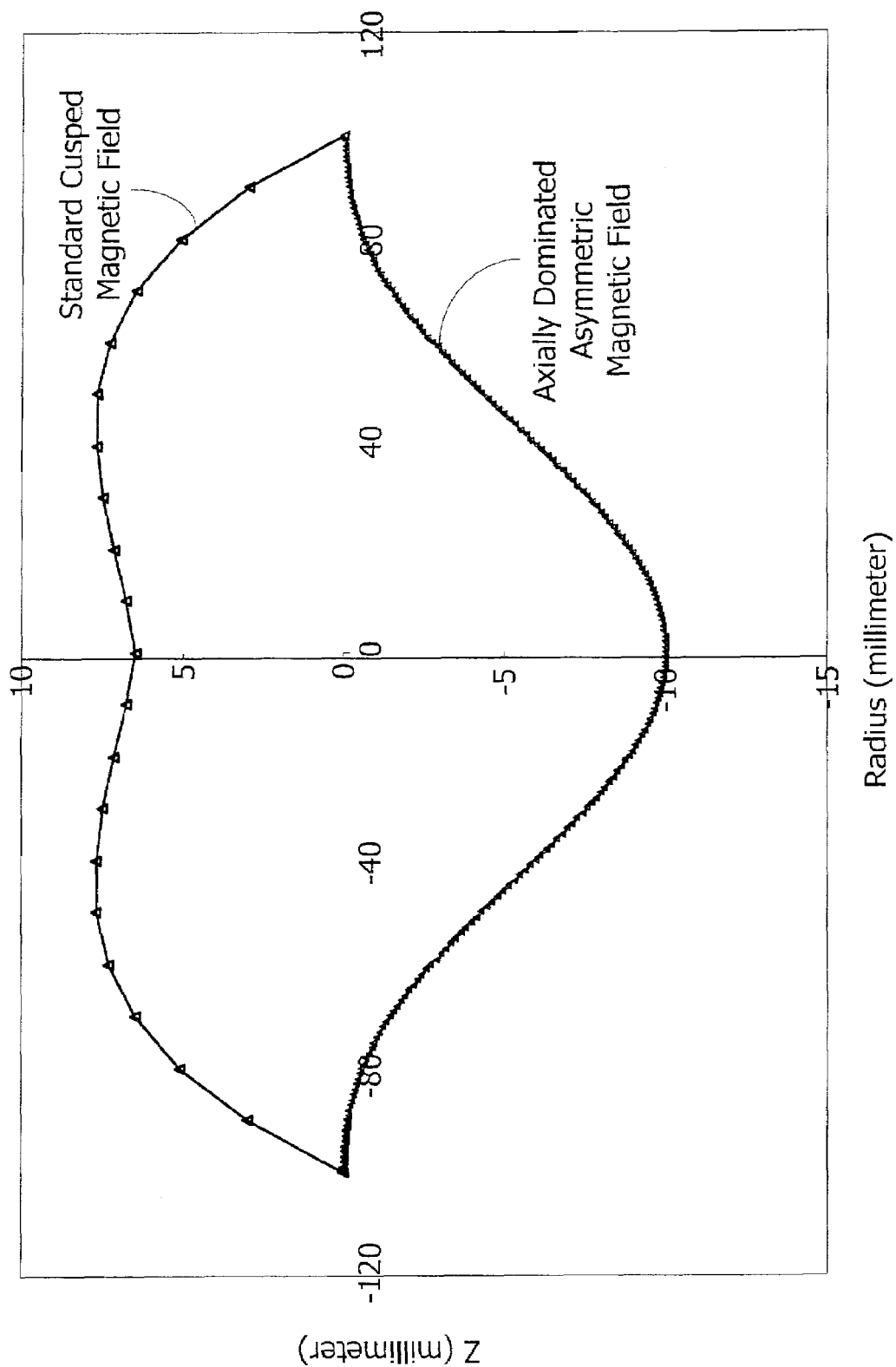
FIG. 7C is an exemplary graph illustrating melt-solid interface shapes generated by an axially dominated asymmetric field according to one embodiment of the invention compared to melt-solid interface shapes generated by a conventional cusped magnetic field.
Figure 7D:
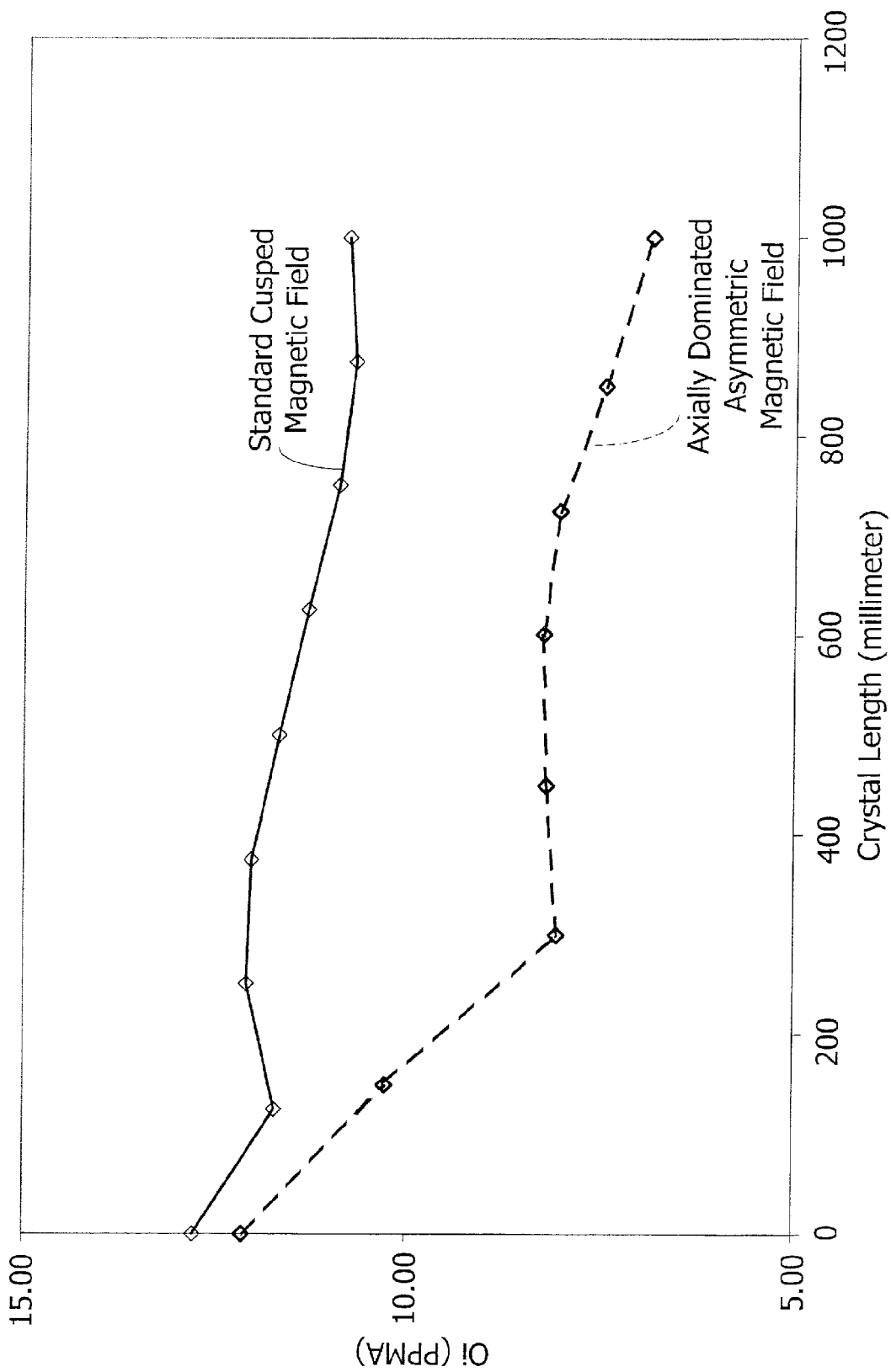
FIG. 7D is an exemplary graph illustrating oxygen concentrations generated by an axially dominated magnetic field according to one embodiment of the invention compared to oxygen concentrations generated by a conventional cusped magnetic field as a function of crystal length.
Figure 7E:
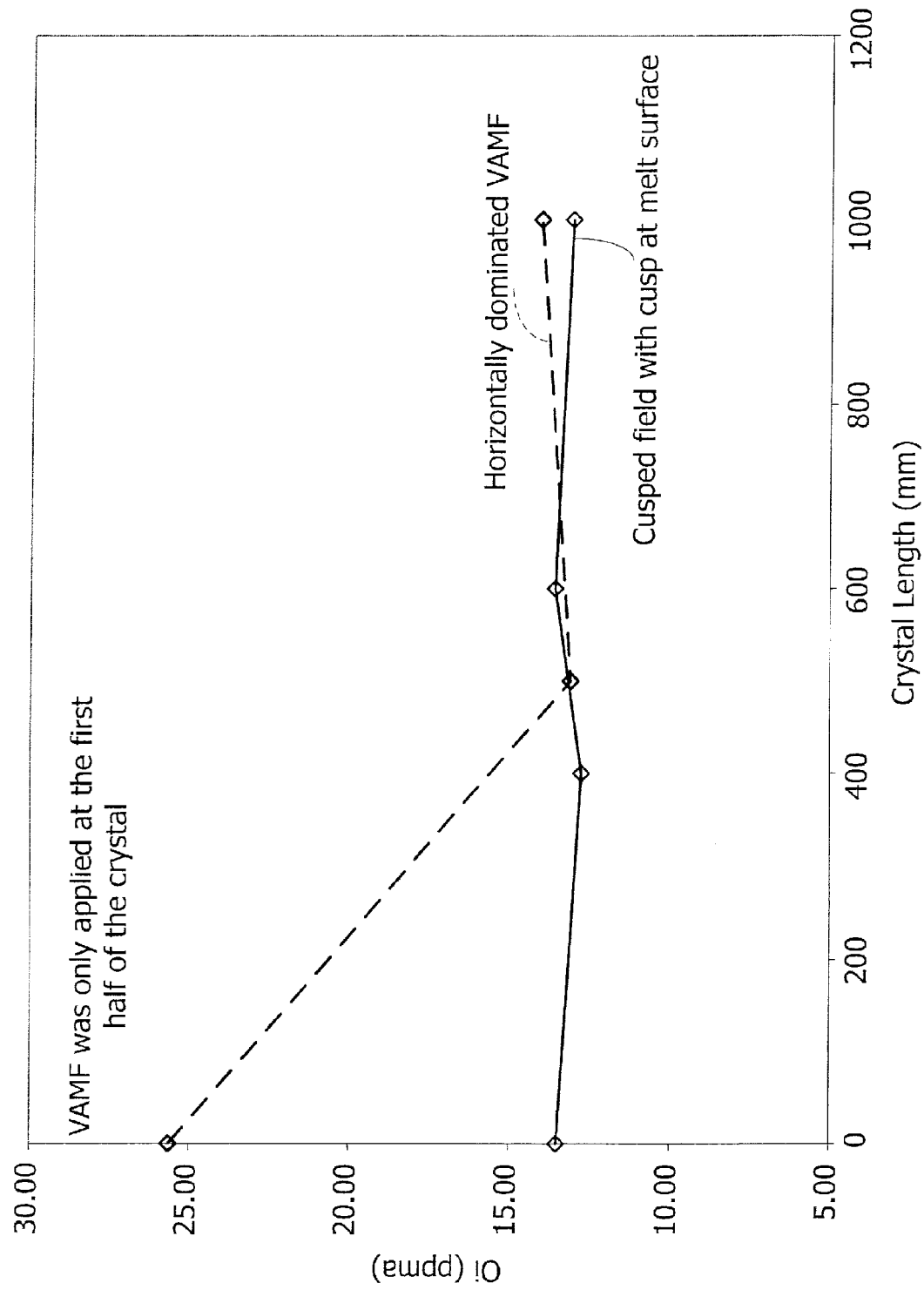
FIG. 7E is an exemplary graph illustrating oxygen concentrations generated by a horizontally dominated magnetic field according to one embodiment of the invention compared to oxygen concentrations generated by a conventional cusped magnetic field as a function of crystal length.

To achieve a more stable melt flow, in some growth stages such as necking, crown, and late-body to end-cone growth, control unit 143 may generate an axially dominated asymmetric magnetic field at melt surface 161 by applying a higher power distribution in lower coil 147 than in upper coil 145 so that the asymmetric magnetic field moves the cusp position to above melt level 111, as shown in FIG. 7A. This field condition leads to a more convex-shaped melt-solid interface and a lower oxygen concentration in crystal 113. FIG. 7B shows an exemplary graph illustrating the power distribution in an axially dominated asymmetric magnetic field. Particularly, FIG. 7B illustrates changes in percentage of power input for both upper and lower coils 145, 147 as a function of changes in crystal length. FIG. 7C shows an exemplary graph illustrating the difference between melt-solid interface shapes generated by an axially dominated asymmetric magnetic field and a standard cusped magnetic field. As may be seen, the melt-solid interface shape generated by the axially dominated asymmetric magnetic field has been adjusted toward a desired direction. FIG. 7D shows an exemplary graph illustrating a difference between oxygen concentrations (Oi) generated by an axially dominated magnetic field and a standard cusped magnetic field as a function of crystal length. FIG. 7E shows an exemplary graph illustrating a difference between oxygen concentrations (Oi) generated by a horizontally dominated magnetic field and a standard cusped magnetic field as a function of crystal length.

Figure 8:
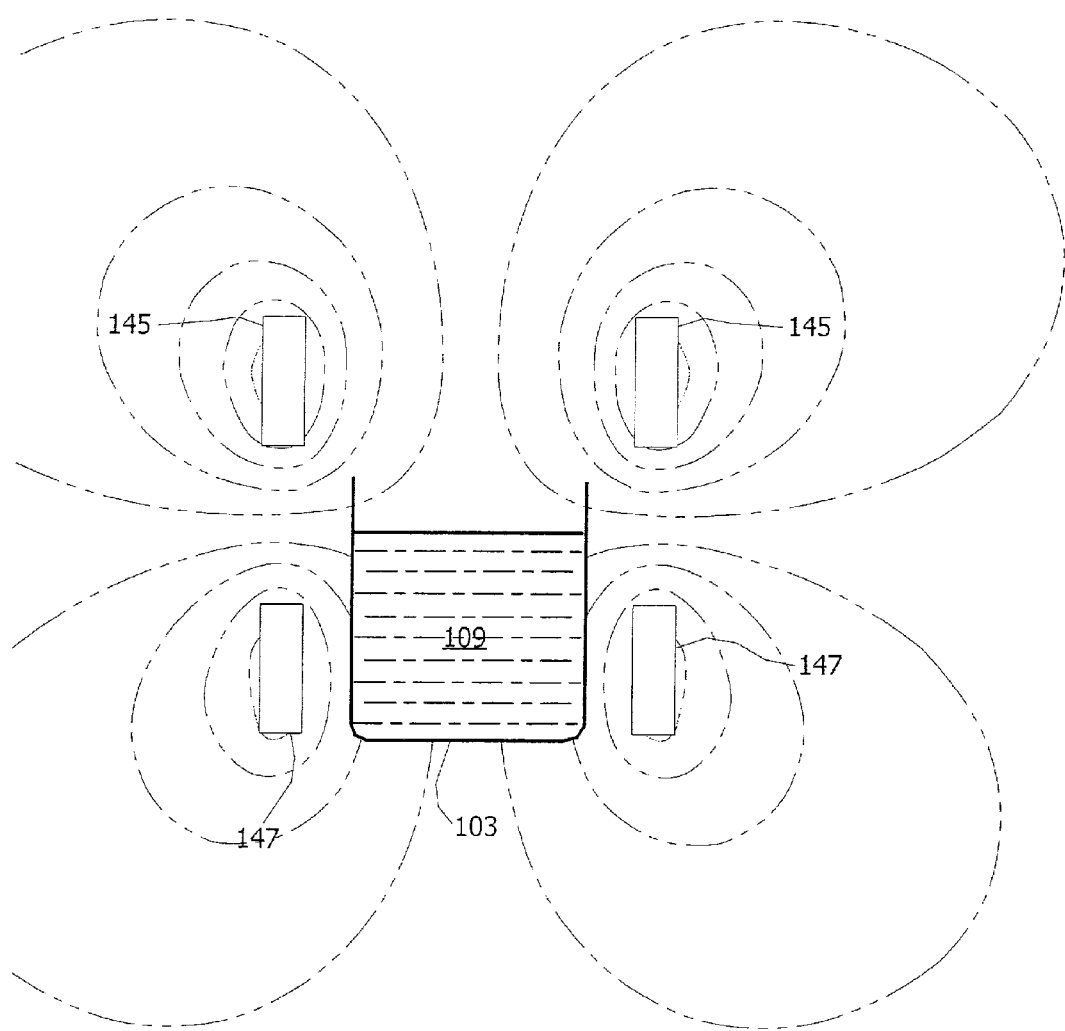
FIG. 8 is a block diagram illustrating a symmetric magnetic field according to one embodiment of the invention.
Figure 9:
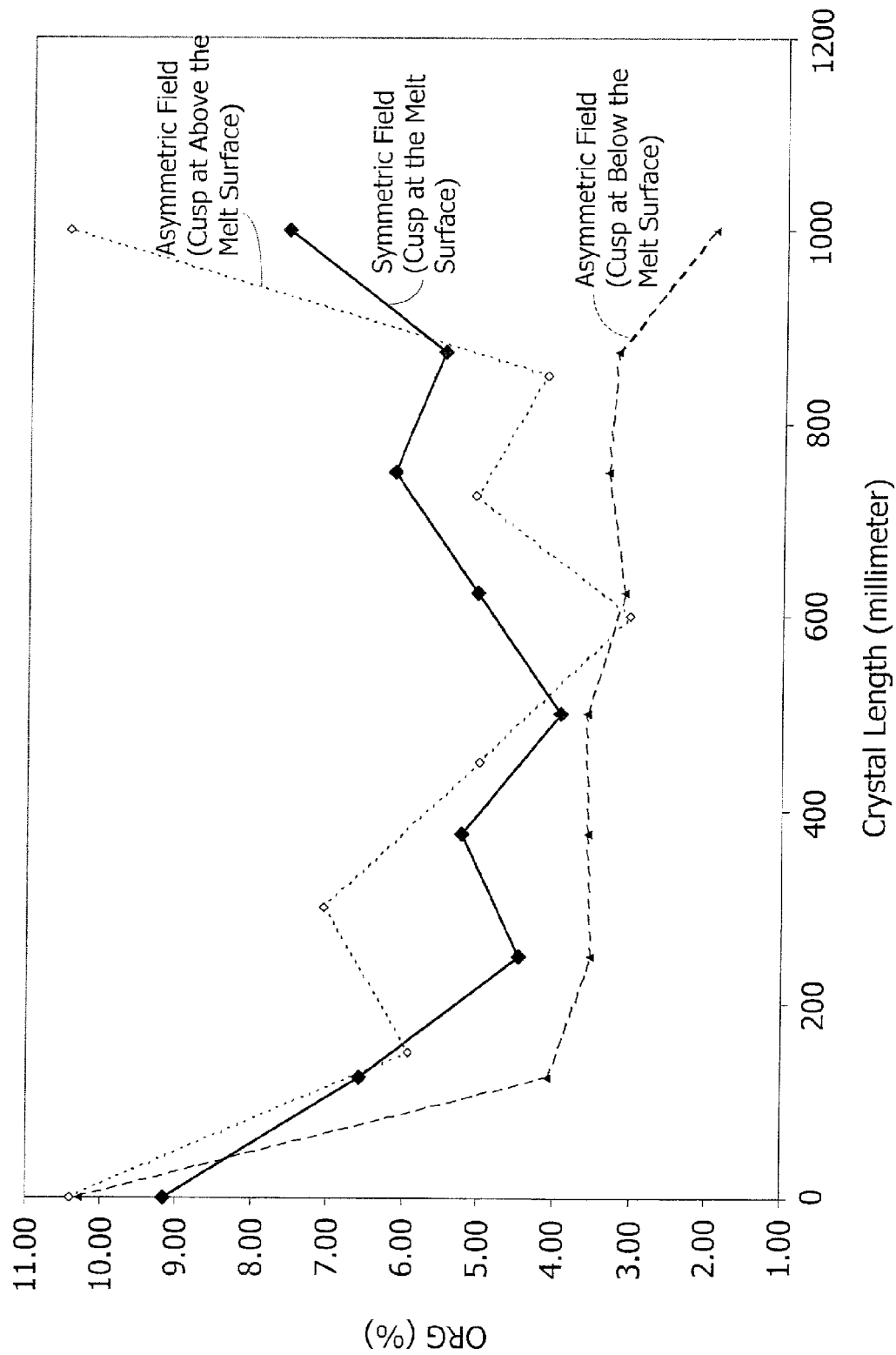
FIG. 9 is an exemplary graph illustrating changing oxygen radial gradients as a function of changes in crystal length when a cusp position is above or below a melt surface and when the cusp position is near the melt surface according to one embodiment of the invention.

In growth stages crystal lengths where the standard cusped magnetic field (e.g., a symmetric magnetic field) is desired, control unit 143 may configure this symmetric setting by applying a substantially uniform power distribution between upper and lower coils 145 and 147 to move the cusp position to near melt level 111, as shown in FIG. 8. FIG. 9 shows an exemplary graph illustrating changing oxygen radial gradients (ORGs) as a function of changes in crystal length when a cusp position is at above or below melt level 111 (i.e., asymmetric magnetic fields) and when the cusp position is at near melt level 111 (i.e., symmetric magnetic field).

Figure 10A:
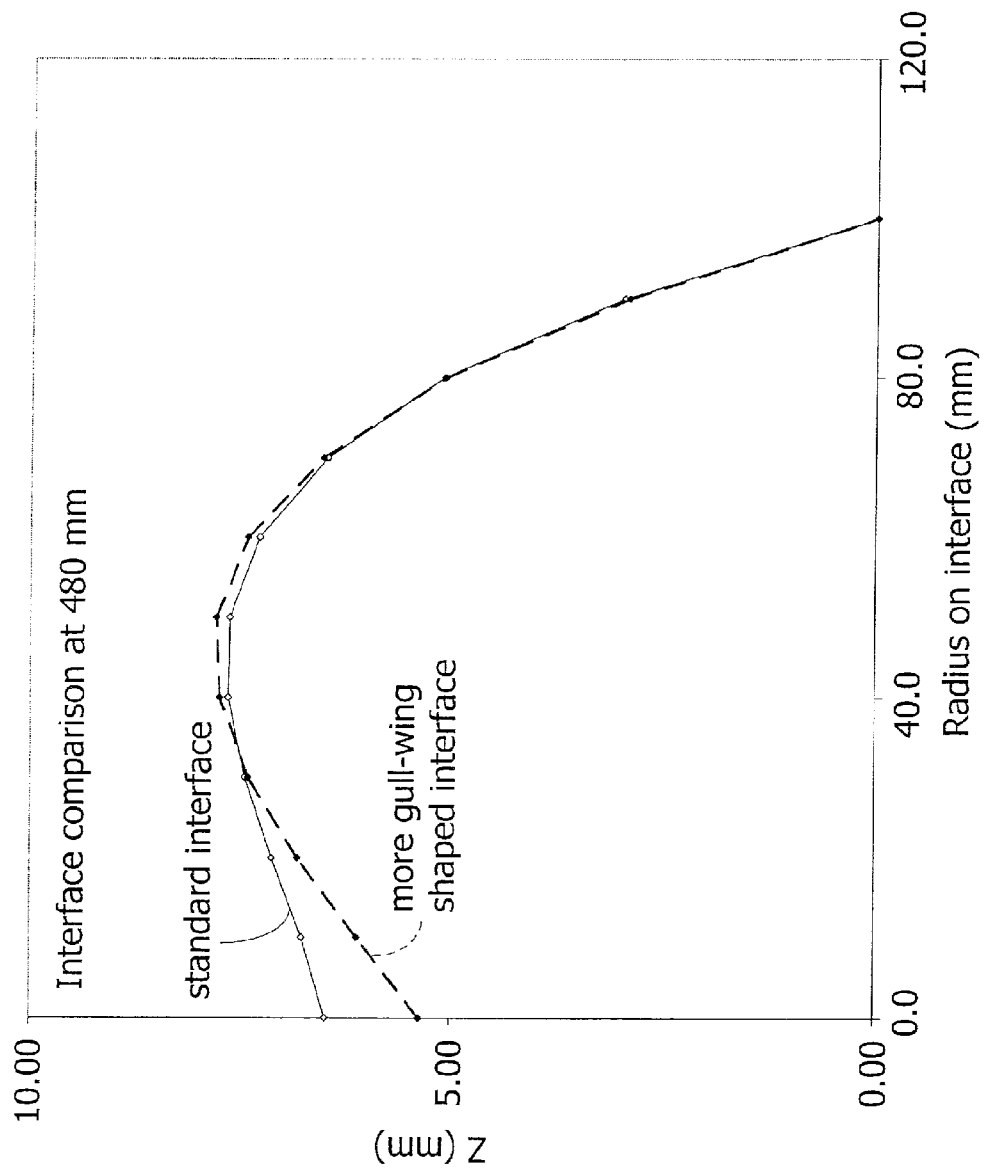
FIG. 10A is an exemplary graph illustrating a melt-solid interface comparison between a standard silicon growth process and crucible rotation modulation according to one embodiment of the invention.
Figure 10B:
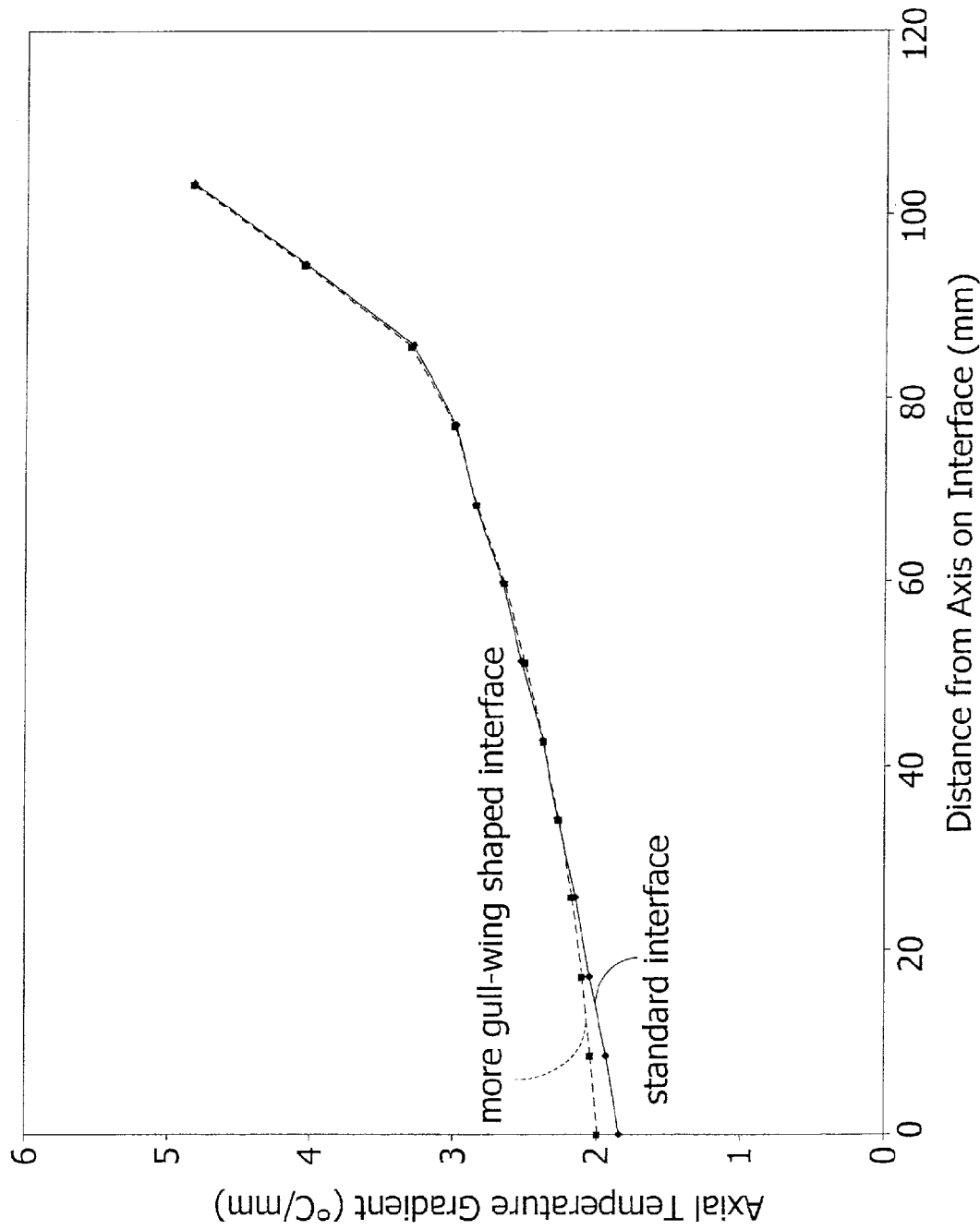
FIG. 10B is an exemplary graph illustrating interface gradients of a crucible rotation modulation according to one embodiment of the invention compared to interface gradients of a conventional silicon growth process.
Figure 10C:
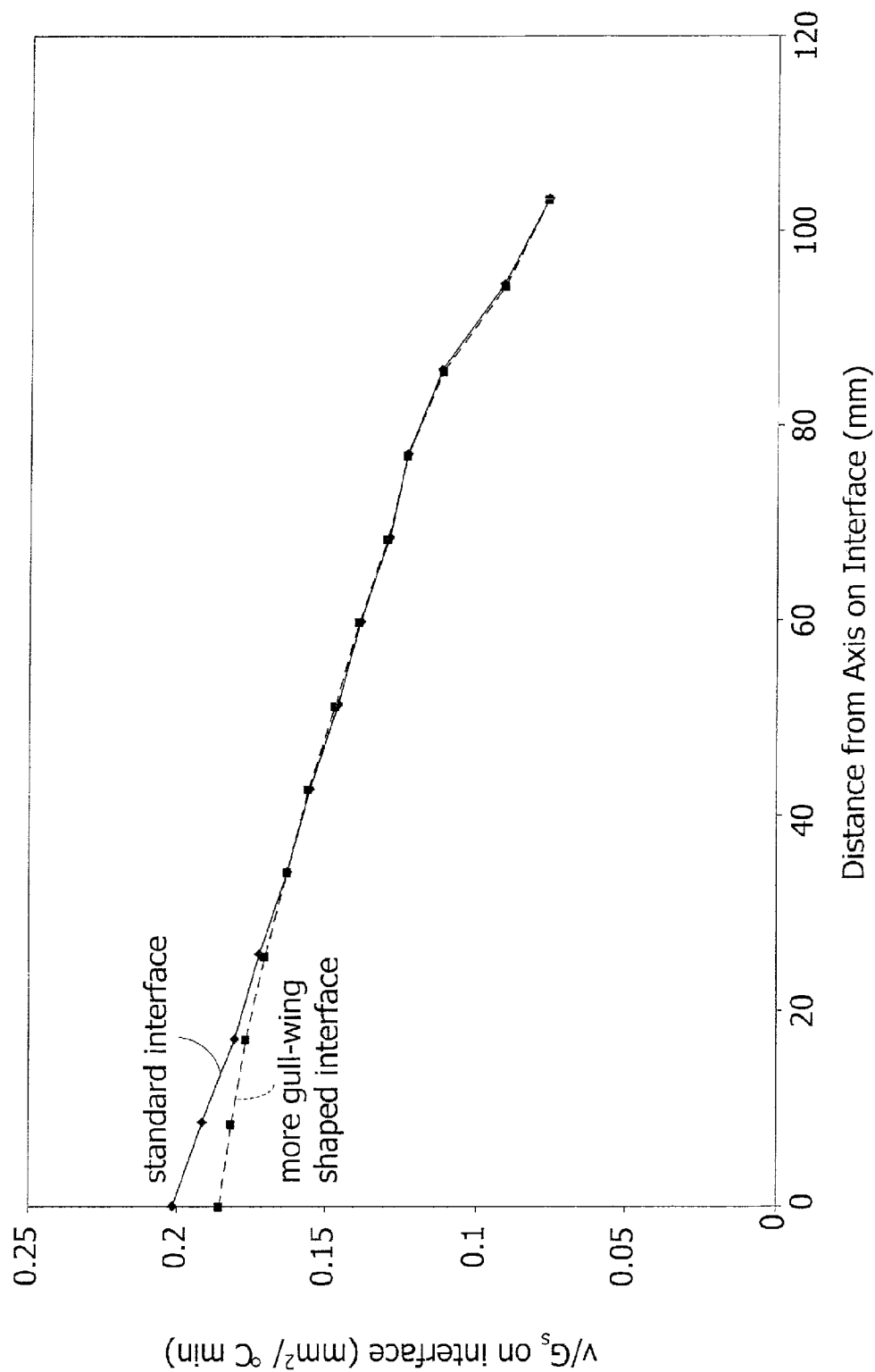
FIG. 10C is an exemplary graph illustrating interface $v/G_s$ of a crucible rotation modulation according to one embodiment of the invention compared to interface $v/G_s$ of a conventional silicon growth process.

As mentioned earlier, applying variable asymmetric magnetic fields at various crystal lengths can generate various desired interface shapes and consequently desired radial and axial temperature gradients as well as $v/G_s$ can be achieved at desired body lengths. FIGS. 6A, 6B and 6C show that horizontally dominated asymmetric magnetic field at melt surface 161 can generate a less concave-shaped and more gull-wing shaped melt-solid interface. FIG. 10A shows an exemplary graph illustrating the melt-solid interface comparison between the standard interface and a more gull-wing shaped interface at a crystal length of 480 mm. FIG. 10B shows an exemplary graph illustrating a difference between interface gradients of the standard interface and a more gull-wing shaped interface. Particularly, FIG. 10B shows changes in axial temperature gradients of the standard interface and a more gull-wing shaped interface as a function of changes in distance from axis on the interface. FIG. 10C shows an exemplary graph illustrating a difference between interface $v/G_s$ of the standard interface and a more gull-wing shaped interface. Particularly, FIG. 10C shows changes in $v/G_s$ on a melt-solid interface of the standard interface and a more gull-wing shaped interface as a function of changes in distance from axis on the interface.

Figure 11:
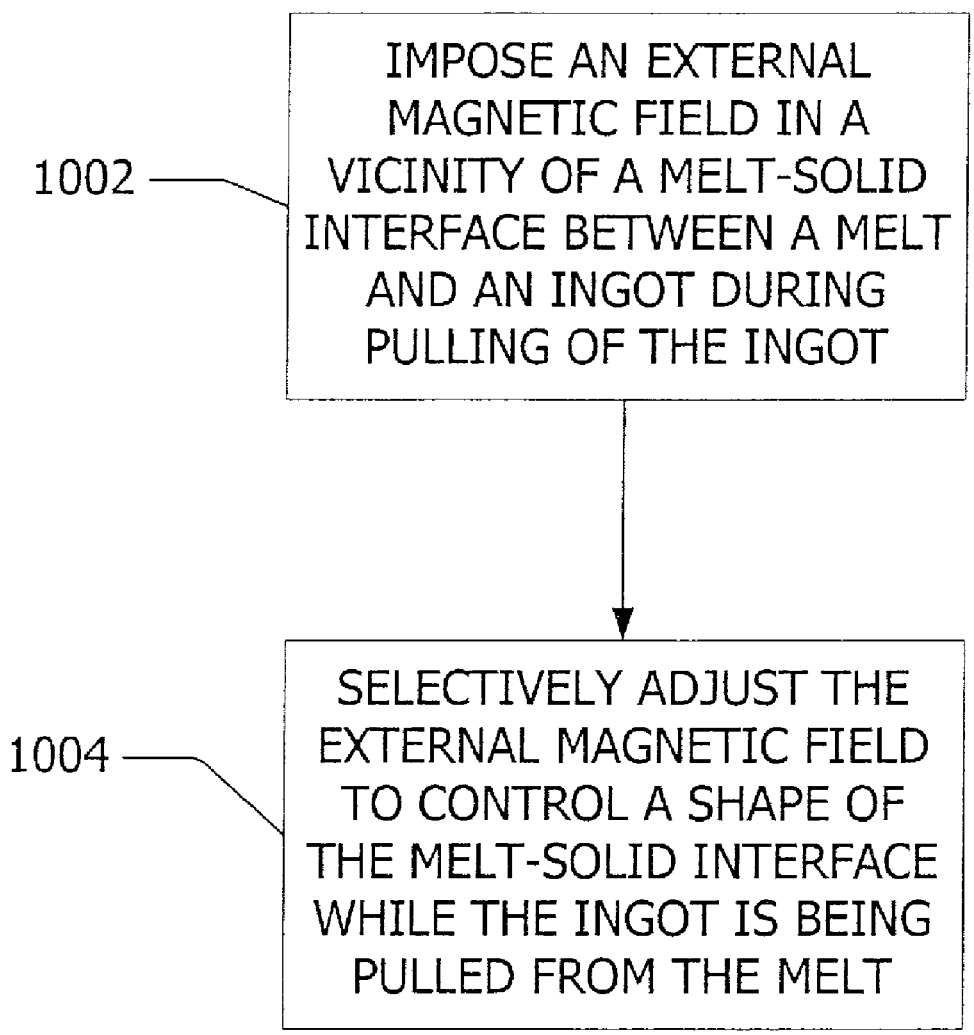
FIG. 11 is an exemplary flow diagram illustrating process flow according to one embodiment of the invention for use in combination with a crystal growing apparatus for growing a monocrystalline ingot according to a Czochralski process.

Referring to FIG. 11, an exemplary flow diagram illustrates process flow according to one embodiment of the invention for use in combination with a crystal growing apparatus for growing a monocrystalline ingot according to a Czochralski process. The crystal growing apparatus has a heated crucible including a semiconductor melt from which the ingot is pulled. The ingot is grown on a seed crystal pulled from the melt. The shape of the melt-crystal interface is formed as a function of a length of the ingot. At 1002, an external magnetic field is imposed in a vicinity of a melt-solid interface between the melt and the ingot during pulling of the ingot. For example, the external magnetic field may be imposed by a first magnet (e.g., a first solenoid) situated at above the melt-solid interface and a second magnet (e.g., a second solenoid) situated at below the melt-solid interface.

At 1004, the external magnetic field is selectively adjusted to control a shape of the melt-solid interface while the ingot is being pulled from the melt. For example, a horizontally dominated asymmetric magnetic field configuration, an axially dominated asymmetric magnetic field configuration, or a symmetric magnetic field configuration may be applied to the vicinity of the melt-solid interface. If the horizontally dominated asymmetric magnetic field configuration is applied, embodiments of the invention achieve a less concave and more gull-wing shaped interface shape relative to the ingot with a flatter and more concave interface, a higher axial temperature at the melt-solid interface, and a lower radial variation of the axial temperature gradient in the ingot at and near the melt-solid interface. If the axially dominated asymmetric magnetic field configuration is applied, embodiments of the invention achieve a more convex interface shape relative to the ingot, a substantially stable melt flow, and a lower level of oxygen concentration in the ingot.

To selectively adjust the external magnetic field, a power distribution of the first magnet and the second magnet is adjust to move a cusp position (e.g., at a variable distance as a function of the length of the ingot and/or a growth stage of the ingot) to above or below the melt-solid interface via a magnetic field intensity generated in the first magnet and the second magnet. Thus, a higher power distribution may be applied in the first magnet than in the second magnet to move the cusp position to below the melt-solid interface to achieve a horizontally dominated asymmetric magnetic field configuration. Similarly, a higher power distribution may be applied in the second magnet than in the first magnet to move the cusp position to above the melt-solid interface to achieve an axially dominated asymmetric magnetic field configuration. Furthermore, a substantially uniform power distribution may be applied between the first magnet and the second magnet to move the cusp position to near the melt-solid interface to achieve a symmetric magnetic field configuration.

To selectively adjust the external magnetic field, a configuration of the external magnetic field and/or an intensity of the external magnetic field may be varied while the ingot is being pulled from the melt and according to the length of the ingot and/or the growth stage (e.g., during necking, crown, or late-body to end-cone growth) of the ingot. The external magnetic field may also be adjusted to control the shape of the melt-solid interface to maintain a level of oxygen concentration and/or a level of oxygen radial gradient in the ingot. The external magnetic field may further be adjusted to achieve a desired shape (e.g., a convex interface shape relative to the ingot, a concave interface shape relative to the ingot, or a gull-wing interface shape) of the melt-solid interface at a desired length of the ingot.

The order of execution or performance of the methods illustrated and described herein is not essential, unless otherwise specified. That is, it is contemplated by the inventors that elements of the methods may be performed in any order, unless otherwise specified, and that the methods may include more or less elements than those disclosed herein.

When introducing elements of the present invention or the embodiments thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A system for controlling crystal growth in a crystal growing apparatus, said crystal growing apparatus having a heated crucible including a semiconductor melt from which a monocrystalline ingot is grown according to a Czochralski process, said ingot being grown on a seed crystal pulled from the melt, said melt and said ingot forming a melt-solid interface therebetween, said system comprising:

first and second coils positioned near the crucible for applying a cusped magnetic field to the melt;

a variable power supply for energizing the coils to produce the magnetic field applied to the melt; and a controller for varying the power supply while the ingot is being pulled from the melt, said variable power supply being responsive to the controller for varying the magnetic field to control cusp position of the magnetic field relative to the melt-solid interface between the melt and the ingot to control a shape of the melt-solid interface, said controlled shape of the melt-solid interface being a function of length of the ingot.

2. The system of claim 1 wherein the variable power supply is responsive to the controller for varying the magnetic field according to one or more of the following types of magnetic field configurations relative to the melt-solid interface: a horizontally dominated asymmetric magnetic field configuration; an axially dominated asymmetric magnetic field configuration; and a substantially symmetric magnetic field configuration.

3. The system of claim 2 wherein the horizontally dominated asymmetric magnetic field produces one or more of the following: a melt-solid interface shape having a flatter concave gull-wing shape relative to the ingot; an increased axial temperature gradient at the melt-solid interface; and a decreased radial variation of the axial temperature gradient in the ingot near the melt-solid interface.

4. The system of claim 2 wherein the axially dominated asymmetric magnetic field produces one or more of the following: a melt-solid interface shape having a more convex shape relative to the ingot; a substantially stable melt flow; and a decreased level of oxygen concentration in the ingot.

5. The system of claim 1 wherein the first coil is positioned higher than the melt-solid interface and the second coil is positioned lower than the melt-solid interface.

6. The system of claim 5 wherein the variable power supply is responsive to the controller for increasing a power distribution in the first coil relative to the second coil to move the cusp position below the melt-solid interface for achieving a horizontally dominated asymmetric magnetic field configuration.

7. The system of claim 5 wherein the variable power supply is responsive to the controller for increasing a power distribution in the second coil relative to the first coil to move the cusp position above the melt-solid interface for achieving an axially dominated asymmetric magnetic field configuration.

8. The system of claim 5 wherein the variable power supply is responsive to the controller for energizing the first and second coils according to a substantially uniform power distribution to move the cusp position near the melt-solid interface for achieving a substantially symmetric magnetic field configuration.

9. The system of claim 5 wherein the controller varies the power supply to selectively adjust a power distribution of the first and second coils as a function of one or more of the following to change the magnetic field intensity thereby moving the cusp position to a particular position above or below the melt-solid interface: length of the ingot; and growth stage of the ingot.

10. The system of claim 9 wherein the growth stage includes one or more of the following: necking; crown; and late-body to end cone growth.

11. The system of claim 1 wherein the controller is responsive to a desired level of oxygen concentration for varying the power supply to selectively adjust the magnetic field to control the shape of the melt-solid interface to produce the desired level of oxygen concentration in the ingot.

12. The system of claim 1 wherein the controller is responsive to a desired level of oxygen radial gradient for varying the power supply to selectively adjust the magnetic field to control the shape of the melt-solid interface to produce the desired level of oxygen radial gradient in the ingot.

13. The system of claim 1 wherein the first and second coils comprise solenoids.

14. The system of claim 1 wherein the variable power supply includes a first coil power supply for energizing the first coil and a second coil power supply for energizing the second coil.

15. A system for controlling crystal growth in a crystal growing apparatus, said crystal growing apparatus having a heated crucible including a semiconductor melt from which a monocrystalline ingot is grown according to a Czochralski process, said ingot being grown on a seed crystal pulled from the melt, said system comprising:
first and second coils positioned near the crucible for applying a cusped magnetic field to the melt, said magnetic field being based on power distributed to said first and second coils;
a first power supply for supplying the first coil with power according to a first power distribution;
a second power supply for supplying the second coil with power according to a second power distribution; and
a controller for controlling the first and second power supplies while the ingot is being pulled from the melt to produce the magnetic field applied to the melt, said controller controlling the first and second power supplies according to the first and second power distributions, respectively, for varying the magnetic field to control a shape of the melt-interface as a function of length of the ingot.

16. The system of claim 15 wherein the controller controls the first and second power distributions such that the first power distribution is greater than the second power distribution to move the cusp position below the melt-solid interface for achieving a horizontally dominated asymmetric magnetic field configuration.

17. The system of claim 15 wherein the controller controls the first and second power distributions such that the second power distribution is greater than the first power distribution to move the cusp position above the melt-solid interface for achieving an axially dominated asymmetric magnetic field configuration.

18. The system of claim 15 wherein the controller controls the first and second power distributions such that the first and second power distributions are substantially uniform power to move the cusp position near the melt-solid interface for achieving a substantially symmetric magnetic field configuration.

19. The system of claim 15 wherein the controller controls the first and second power distributions, relative to each other, as a function of one or more of the following to change the magnetic field intensity thereby moving the cusp position to a desired position above or below the melt-solid interface: length of the ingot; and growth stage of the ingot.

20. A system for producing a monocrystalline semiconductor ingot by a Czochralski process, said system comprising:
a crystal growing apparatus having a heated crucible, said crucible containing a semiconductor melt from which the ingot is grown on a seed crystal pulled from the melt, said melt and said ingot forming a melt-solid interface therebetween;
first and second coils positioned near the crucible for applying a cusped magnetic field to the melt;
a variable power supply for energizing the coils to produce the magnetic field applied to the melt; and
a controller for varying the power supply while the ingot is being pulled from the melt, said variable power supply being responsive to the controller for varying the magnetic field to control cusp position of the magnetic field relative to the melt-solid interface between the melt and the ingot for controlling a shape of the melt-solid interface, said controlled shape of the melt-solid interface being a function of length of the ingot.

* * * * *